(12) United States Patent  
Fujiyoshi et al.

(10) Patent No.: US 8,008,633 B2
(45) Date of Patent: Aug. 30, 2011

(54) SPECIMEN STAGE-MOVING DEVICE FOR CHARGED-PARTICLE BEAM SYSTEM

(75) Inventors: Yoshinori Fujiyoshi, Kyoto (JP); Tomohisa Fukuda, Tokyo (JP)

(73) Assignee: Jeol, Ltd., Tokyo (JP)

( * ) Notice: Subject to any disclaimer, the term of this patent is extended or adjusted under 35 U.S.C. 154(b) by 644 days.

(21) Appl. No.: 12/057,835

(22) Filed: Mar. 28, 2008

(65) Prior Publication Data

US 2009/0230319 A1    Sep. 17, 2009

(30) Foreign Application Priority Data

Mar. 30, 2007    (JP) .................................. 2007-094862

(51) Int. Cl.
*G01F 23/00* (2006.01)
(52) U.S. Cl. ................... 250/440.11; 250/306
(58) Field of Classification Search .................. None
See application file for complete search history.

(56) References Cited

U.S. PATENT DOCUMENTS

| | | | | |
|---|---|---|---|---|
| 4,587,431 A | * | 5/1986 | Uemura | 250/442.11 |
| 4,771,178 A | * | 9/1988 | Egle et al. | 250/442.11 |
| 5,216,235 A | * | 6/1993 | Lin | 250/201.6 |
| 5,303,035 A | * | 4/1994 | Luecke et al. | 356/399 |
| 5,815,594 A | * | 9/1998 | Tanaka | 382/151 |
| 7,220,973 B2 | * | 5/2007 | Yu et al. | 250/442.11 |
| 2003/0047689 A1 | * | 3/2003 | Kasai | 250/442.11 |
| 2004/0108067 A1 | * | 6/2004 | Fischione et al. | 156/345.38 |
| 2004/0251413 A1 | * | 12/2004 | Suzuki et al. | 250/309 |
| 2005/0103997 A1 | * | 5/2005 | Muller | 250/311 |
| 2005/0123979 A1 | * | 6/2005 | Weiss et al. | 435/6 |
| 2005/0140379 A1 | * | 6/2005 | Furukawa et al. | 324/751 |
| 2006/0192574 A1 | * | 8/2006 | Furukawa et al. | 324/750 |
| 2007/0045557 A1 | * | 3/2007 | Angel et al. | 250/396 R |
| 2007/0145267 A1 | * | 6/2007 | Adler et al. | 250/310 |
| 2008/0073559 A1 | * | 3/2008 | Horsky et al. | 250/428 |
| 2009/0009033 A1 | * | 1/2009 | Voigtlander et al. | 310/323.02 |

FOREIGN PATENT DOCUMENTS

| | | |
|---|---|---|
| JP | 2000-208083 | 7/2000 |
| JP | 2002-134053 | 5/2002 |
| JP | 2007-026815 | 2/2007 |

* cited by examiner

*Primary Examiner* — Phillip A Johnston
*Assistant Examiner* — Andrew Smyth
(74) *Attorney, Agent, or Firm* — The Webb Law Firm

(57) ABSTRACT

A charged-particle beam system is offered which is equipped with a Z-motion mechanism to enable tomography. The Z-motion mechanism includes a rotary disk having three tapering surfaces on which balls are nested. The rotary disk is rotated via a worm gear to cause the balls to go upward along the tapering surfaces. This pushes an overlying elevatable disk upward, i.e., in the Z-direction. Consequently, the specimen stage is pushed up in the Z-direction.

10 Claims, 18 Drawing Sheets

(a) ← rectilinear motion →

(b) ← rectinear motion →

SPECIMEN STAGE-MOVING DEVICE FOR CHARGED-PARTICLE BEAM SYSTEM

BACKGROUND OF THE INVENTION

1. Field of the Invention

The present invention relates to a charged-particle beam system (i.e., an analytical instrument using an electron beam or ion beam) equipped with a cryogenic specimen stage and adapted for imaging and analyzing a specimen and, more particularly, to a specimen stage-moving device enabling Z motion of such a specimen stage.

2. Description of Related Art

Generally, where a medical or biological specimen is observed with a charged-particle beam system, if the specimen is irradiated with an electron beam, the morphology may be destroyed. As a result, it may not be possible to observe the specimen under normal state. In this case, if the specimen is cooled cryogenically, the specimen is less likely to be destroyed by electron beam irradiation and it is possible to observe the specimen under normal state. A known specimen-cooling device is described in Japanese Patent Document JP-A-2000-208083 cited below. This specimen-cooling device has a specimen-holding member, two refrigerant tanks for storing two kinds of refrigerants for cooling a specimen, and two capillaries for placing the tanks in communication with a refrigerant reservoir. The specimen-holding member is centrally provided with a specimen-holding portion for holding the specimen. The refrigerant reservoir is formed in an outer portion of the specimen-holding portion and holds the refrigerants therein. The specimen-cooling device has a mechanism for selectively supplying the two kinds of refrigerants to the refrigerant reservoir.

Known cryogenic specimen-tilting devices permitting a specimen to be imaged and analyzed while the specimen is cooled and tilted are described in the Japanese Patent Documents JP-A-2002-134053 and JP-A-2007-26815. JP-A-2002-134053 discloses a tilting device permitting a specimen to be imaged while the tilt angle of the specimen is being adjusted under the condition where the specimen is cooled down to a low temperature. JP-A-2007-26815 discloses a rotary member for tilting a specimen stage. The rotary member can adjust the specimen to a large tilt angle while the specimen is cooled cryogenically. Furthermore, the rotary member can make the specimen holder smaller and thinner.

In a charged-particle beam system equipped with a cryogenic top-entry specimen stage, a specimen can be imaged and analyzed while the specimen is cooled and moved or tilted in the X- and Y-directions by the prior art.

However, this system is not equipped with any Z-motion mechanism. If a Z-motion mechanism can be equipped in the prior-art charged-particle beam system having a cryogenic top-entry specimen stage, then tomography will be enabled. The tomography is a technique of reconstructing a three-dimensional internal structure of a specimen by tilting the specimen continuously, taking multiple projection images, and image-processing the images by a computer.

SUMMARY OF THE INVENTION

In view of the foregoing circumstances, the present invention has been made. It is an object of the present invention to provide a Z-motion specimen stage which is for use in a charged-particle beam system and which has a Z-motion mechanism to thereby enable tomography.

A specimen stage-moving device which is built according to one embodiment of the present invention and which is for use in a charged-particle beam system has a top-entry specimen stage and a Z-motion mechanism. The specimen stage moves within the XY-plane in an interlocking manner with a support plate for an XY-motion mechanism. The Z-motion mechanism moves the specimen stage in the Z-direction perpendicular to the XY-plane, using a rotary mechanism. Thus, the above-described object is achieved.

The Z-motion mechanism preferably moves the specimen stage in the Z-direction by causing rolling members to pass onto the tapering surfaces of a rotary disk that is rotationally manipulated using the rotary mechanism. Preferably, the rolling members are balls, rollers, or bearings.

Preferably, the Z-motion mechanism has a rotary disk rotationally manipulated using the rotary mechanism and an elevatable disk disposed over the rotary disk. The specimen stage is preferably moved in the Z-direction by causing point contact members held to the bottom surface of the elevatable disk to pass onto the tapering surfaces of the rotary disk. Preferably, the point contact members are balls.

Preferably, the Z-motion mechanism makes horizontal the specimen surface of the specimen stage by three-point contact of balls or rollers.

Preferably, the Z-motion mechanism thermally insulates the specimen surface of the specimen stage by three-point contact of balls or rollers. Preferably, the Z-motion mechanism sets the center axis of the specimen stage by making an adjustment using at least three balls.

Preferably, the Z-motion mechanism restricts movement of the specimen stage in the Z-direction with a spring. Preferably, the Z-motion mechanism is mounted within the support plate for the XY-motion mechanism. Preferably, the Z-motion mechanism produces rotation of the rotary mechanism by elongation and contraction of the spring.

The Z-motion mechanism preferably has a rotary disk rotationally manipulated using the rotary mechanism. Preferably, the Z-motion mechanism sets the center axis of the rotary disk by rotary members arranged in three locations on the outer surface of the rotary disk. At least one rotary member is disposed in each one of the three locations.

Preferably, the Z-motion mechanism has a rotary disk rotationally manipulated using the rotary mechanism. Preferably, a leaf spring for hindering rotation of the rotary disk is mounted at least in one location on the outer surface of the rotary disk.

Preferably, the Z-motion mechanism has a rotary disk rotationally manipulated using the rotary mechanism. A worm wheel is formed on the outer surface of the rotary disk. The disk is rotationally manipulated by the rotary mechanism via a worm gear in mesh with the worm wheel. The worm wheel and worm gear have their respective sliding portions each of which preferably forms a solid lubricative coating. Preferably, the lubricative coating is made of a fluororesin.

A specimen stage-moving device which is built according to one embodiment of the present invention and which is for use in a charged-particle beam system achieves the above-described object by including a top-entry specimen stage, an XY-motion mechanism for moving the specimen stage within an XY-plane, and a Z-motion mechanism for moving the specimen stage in a Z-direction perpendicular to the XY-plane via two contact balls and utilizing a lever. Preferably, the Z-motion mechanism thermally insulates the specimen stage.

Furthermore, the specimen stage-moving mechanism which is built according to one embodiment of the present invention and which is for use in a charged-particle beam system preferably has a tilt mechanism for tilting the specimen stage.

The specimen stage-moving device which is built according to one embodiment of the present invention and which is for use in a charged-particle beam system enables tomography by adding the Z-motion mechanism.

During Z-motion, axial misalignment is prevented. Consequently, vibrations can be suppressed.

These and other objects and advantages of the present invention will become more apparent as the following description proceeds.

DESCRIPTION OF THE PREFERRED EMBODIMENTS

The preferred mode for carrying out the present invention is hereinafter described with reference to the drawings. A first embodiment of a specimen stage-moving device which is associated with the present invention and which is for use in a charged-particle beam system is described. The first embodiment is a transmission electron microscope that is a specific example of a charged-particle beam system. The first embodiment is a cryogenic electron microscope for observing a specimen under the condition where the specimen is cooled cryogenically. The first embodiment is a top-entry type in which a specimen is placed in position on a specimen stage from above the objective lens, using a manipulator.

Figure 1:
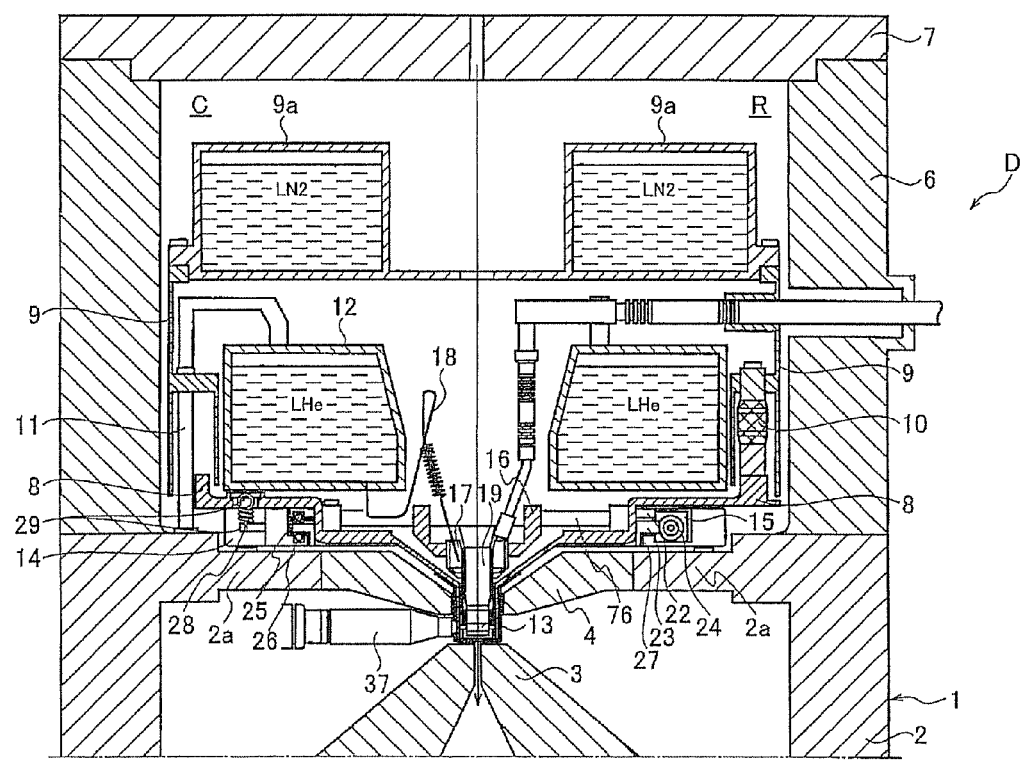
FIG. 1 is a cross-sectional view of main portions of a cryogenic electron microscope forming a first embodiment.

FIG. 1 is a cross-sectional view of main portions of the cryogenic electron microscope, generally indicated by D. An objective lens 1 forms a part of the microscope D and has a yoke 2, a bottom polepiece 3, and a top polepiece 4. The bottom polepiece 3 is formed integrally with a central portion of the yoke 2. The top polepiece 4 is formed integrally with an upper part of the yoke 2 that is located above the bottom polepiece 3.

The transmission electron microscope D has a cylindrical outer wall 6 that is integrally coupled to the side wall of the yoke 2 over the yoke 2. A partition wall 7 is connected to the upper end of the outer wall 6. A specimen chamber R that is maintained in a vacuum is formed inside the outer wall 6 and partition wall 7.

A specimen-cooling device C has a disk-like thermal shield member 8 that is disposed in the specimen chamber R. A cylindrical thermal shield cooling member 9 is connected with the upper end of the thermal shield member 8 via a braided wire 10 made of a thermally conductive material. A tank 9a in which liquid nitrogen LN2 is stored is mounted on the upper end of the thermal shield member 9. Because the liquid nitrogen LN2 stored in the tank 9a cools the thermal shield cooling member 9, the cooling temperature is almost transmitted to the thermal shield member 8 via the braided wire 10. The thermal shield member 8 is cooled to a similar extent.

An annular liquid helium tank 12 is held inside the thermal shield cooling member 9 via plural thermally insulated pipes (only one is shown in FIG. 1) 11. Liquid helium LHe is stored in the liquid helium tank 12.

An XY-motion mechanism 14 for moving a top-entry specimen stage 13 in the X- and Y-directions and a Z-motion mechanism 15 for moving the specimen stage 13 in the Z-direction perpendicular to the XY-plane are mounted on the top surface of the portion 2a of the yoke 2 located under the liquid helium tank 12. The position of the specimen stage 13 can be adjusted such that the stage can be moved in the Z-direction as well as in the X- and Y-directions. The XY-motion mechanism 14 and Z-motion mechanism 15 will be described in detail later.

A cooling portion 16 is mounted below the liquid helium tank 12 and has a He pot 17. Liquid helium LHe is supplied into the He pot 17 from a capillary 18 connected with the liquid helium tank 12. The cooling portion 16 has a cylindrical holder installation hole 19 inside the He pot 17. The specimen stage 13 is held inside the hole 19.

The thermal shield member 8 is coupled to the He pot 17 located inside the cooling portion 16 via a thermally insulated pipe 76. The specimen stage 13 is connected with the front end of the He pot 17 inside the holder installation hole 19. The specimen stage 13 is cooled by the thermal shield member 8 and He pot 17. The XY-motion mechanism 14 is coupled to the thermal shield member 8. That is, as the XY-motion mechanism 14 moves, the specimen on the specimen stage 13 is moved in the X- or Y-direction via the thermal shield member 8 and He pot 17.

The portion of the capillary 18 connected with the He tank 12 which is connected with the He pot 17 is shaped like a coil. When the cooling portion 16 and specimen stage 13 are adjusted in position, their motions are not hindered.

Figure 2:
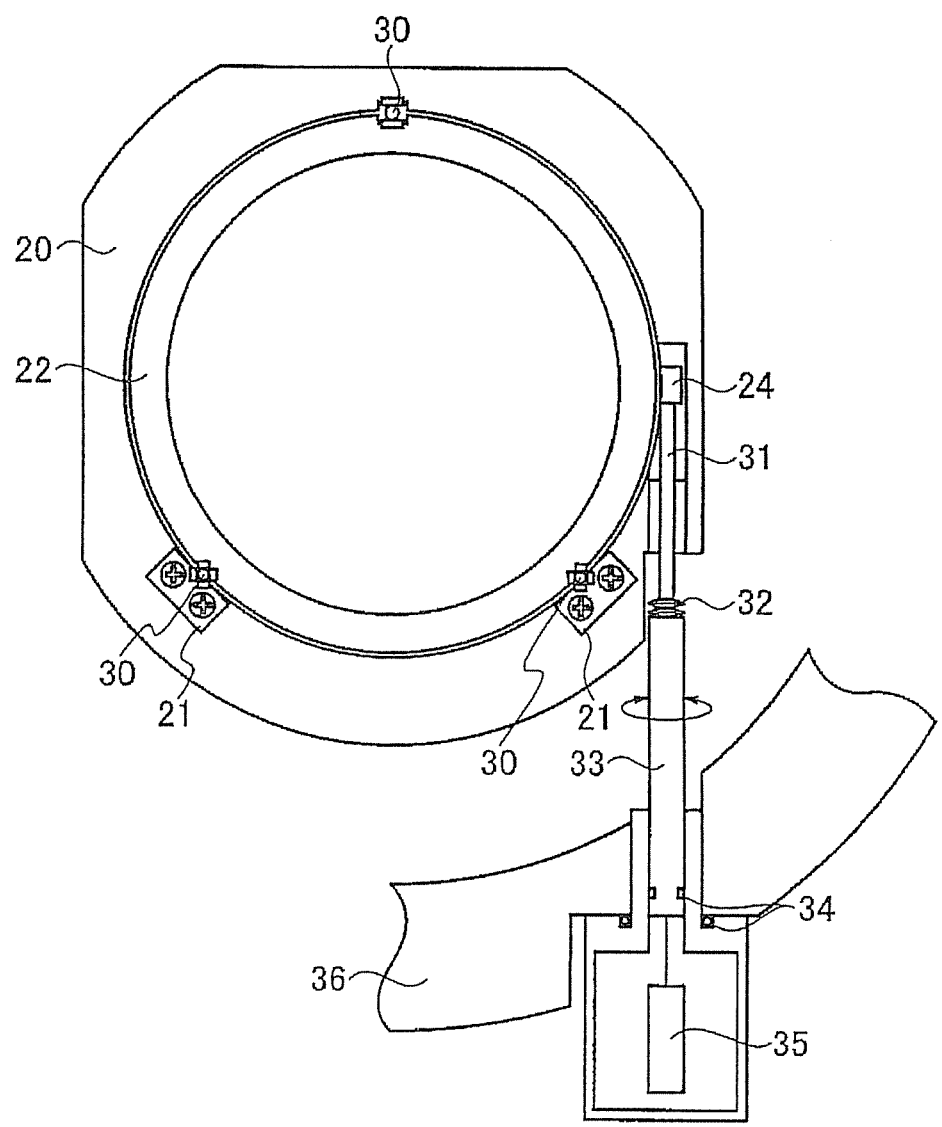
FIG. 2 is a top view of the XY-motion mechanism and Z-motion mechanism shown in FIG. 1.

FIG. 2 is a top view of the XY-motion mechanism 14 (support plate 20 for the XY-motion mechanism) and Z-motion mechanism 15.

The XY-motion mechanism 14 moves the specimen stage 13 within the XY-plane. The Z-motion mechanism 15 moves the specimen stage 13 in the Z-direction perpendicular to the XY-plane, using a rotary mechanism.

As shown in FIG. 2, the XY-motion mechanism 14 has the support plate 20 for the XY-motion mechanism. The support plate 20 is coupled to a block 21.

As shown in FIG. 1, the Z-motion mechanism 15 has an elevatable disk 22, a rotary disk 23, and a worm gear 24. Furthermore, the Z-motion mechanism includes balls 25, 26, and bearings 27. The elevatable disk 22 is coupled to the thermal shield member 8.

Figure 3:
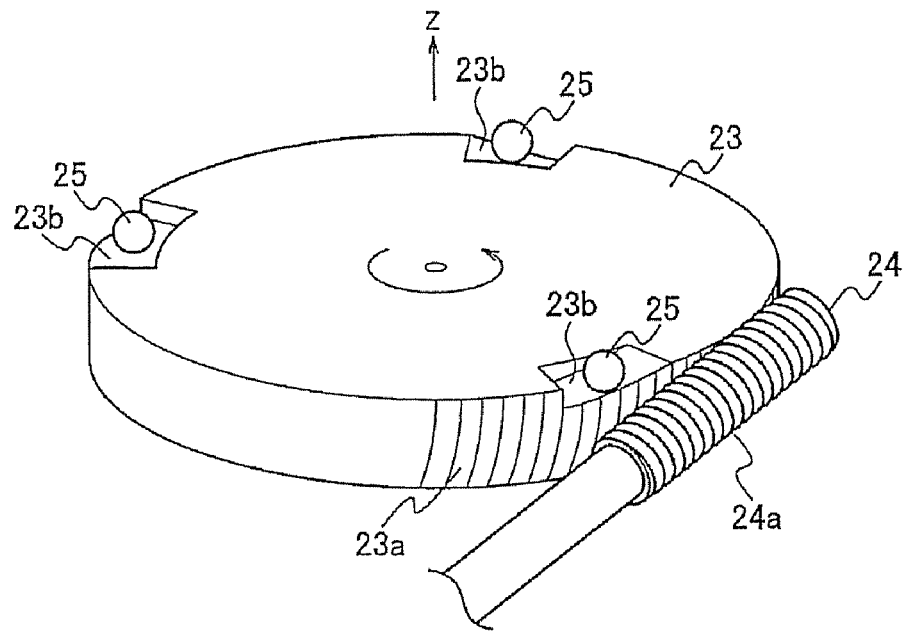
FIG. 3 is a perspective view of a disk and a worm gear included in the Z-motion mechanism shown in FIG. 2.

FIG. 3 is a perspective view of the rotary disk 23 and worm gear 24 included in the Z-motion mechanism 15.

Figure 4:
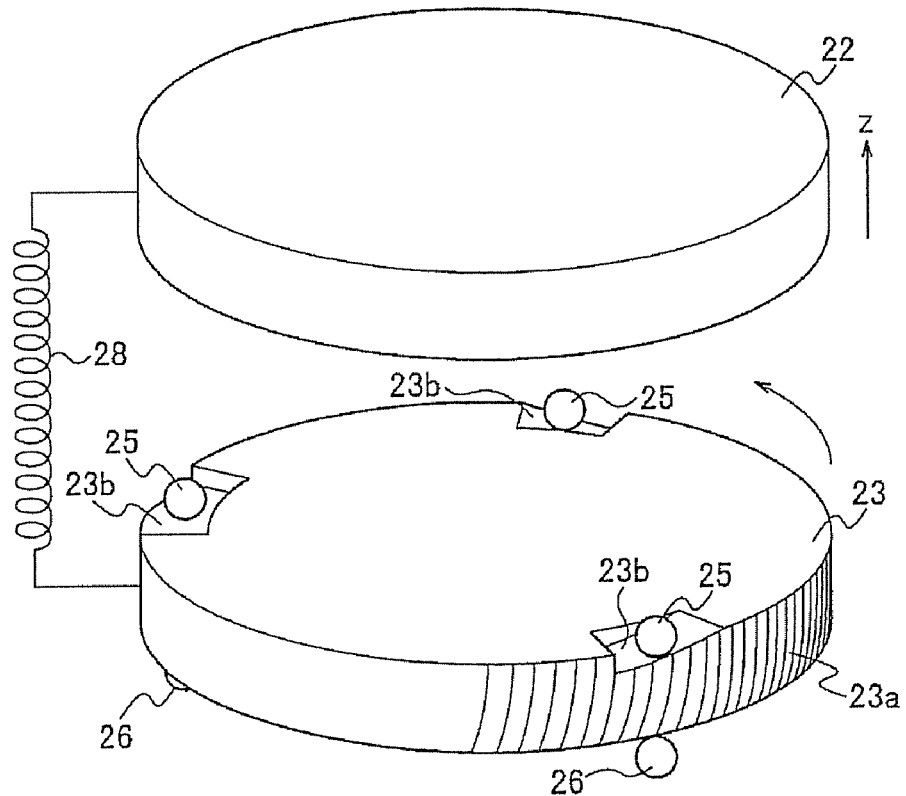
FIG. 4 is a schematic perspective view of an elevatable disk and a rotary disk.

FIG. 4 is a schematic perspective view of the elevatable disk 22 and rotary disk 23. The rotary disk 23 is toothed to form a worm wheel 23a, which is kept in mesh with teeth 24a of the worm gear 24. The top surface of the rotary disk 23 is machined to form three similar tapering surfaces 23b.

In FIG. 1, the bearings 27 are coupled to the support plate 20 for the XY-motion mechanism. The center axes of the bearings 27 are set, i.e., placed on the charged particle beam as shown. The center axis of the rotary disk 23 is set via the bearings 27.

The balls 25 that are point contact members are rigidly coupled to the elevatable disk 22. The balls 26 are rigidly coupled to the support plate 20 for the XY-motion mechanism. The number of the balls 25 is three. The number of the balls 26 is also three. Each ball is in point contact with the rotary disk 23 and acts also to provide thermal insulation. Since the balls 26 are in contact with the rotary disk 23 at three points, the disk 23 creates an ideal horizontal plane. Similarly, the balls 25 are in contact with the three tapering surfaces 23b of the rotary disk 23 at three points. The elevatable disk 22 similarly creates an ideal horizontal plane. This horizontal plane causes the thermal shield member 8 to create a horizontal plane via the elevatable disk 22. That is, the specimen surface is kept parallel to all of the support plate 20, elevatable disk 22, and rotary disk 23. The specimen surface is vertical to the charged particle beam.

In FIG. 1, a spring 28 for holding the specimen stage in the Z-direction is caught on pins 29 (only one is shown). The pins 29 are mounted on the thermal shield member 8 and support plate 20, respectively. Movement of the specimen stage in the Z-direction is restricted by the spring 28.

Referring to FIG. 2, balls 30 are used to set the center axis of the elevatable disk 22. The support plate 20 for the XY-motion mechanism is coupled to the block 21 as mentioned previously. The center axis of the elevatable disk 22 can be set by finely adjusting the position of the block 21.

In FIG. 2, a thermally insulated pipe 31 is in mesh with the worm gear 24, and is connected with a shaft 33 via a laminated spring 32. The shaft 33 introduces rotation of a motor 35 mounted outside the electron optical column 36 of the electron microscope D. When the specimen stage is moved in the X- or Y-direction, the laminated spring 32 permits the specimen stage to move flexibly and enables introduction of the rotation. A vacuum seal 34 is mounted in the portion connected with the external motor 35 to maintain the vacuum state inside the electron optical column 36.

The transmission cryo-electron microscope D has a tilt mechanism 37 for tilting the specimen stage 13. The specimen under a tilted state can be observed. The tilting can be done by the tilt mechanism 37 by adopting the technique described in the above-cited JP-A-2002-134053 and JP-A-2007-26815.

For example, JP-A-2002-134053 discloses a specimen holder installation member, a refrigerant supply device having a refrigerant tank storing a refrigerant and a refrigerant supply member for supplying the refrigerant in the refrigerant tank into a pot, a refrigerant vapor-discharging device for expelling the refrigerant vapor evaporated from the pot, and a specimen installation member-tilting mechanism for tilting a specimen installation member about the tilted axis by moving a second support member up or down. The specimen holder installation member has a holder cylinder, the specimen installation member, a specimen holder, a cooling cylinder, a first support member, and the second support member. A holder cylinder installation hole is formed in the specimen holder installation member for the specimen holder. The inside diameter of the hole decreases in going downward. The holder cylinder has an outer surface whose outside diameter decreases in going downward. The outer surface is fitted in the holder cylinder installation hole. The specimen installation member is provided with a specimen installation hole extending vertically. The specimen installation member is supported to a lower part of the holder cylinder so as to be tiltable about a tilted axis that is horizontal to a lower part of the holder cylinder. The specimen holder has a first and a second supported members on the opposite sides of the specimen installation member as viewed from the tilted axis. A specimen chamber is formed in and surrounded by an electron optical column. The cooling cylinder is disposed in the specimen chamber. The outer surface of the specimen holder whose outside diameter decreases in going downward fits over the cooling cylinder. The holder cylinder installation hole having a centerline extending vertically is formed in the cooling cylinder. The pot in which a refrigerant is stored is mounted in the cooling cylinder. The specimen holder installation member protrudes into the holder cylinder installation hole and supports the first support member and the second supported member. When the specimen holder is installed in the holder cylinder installation hole, the first support member supports a first supported member mounted on one side of the specimen holder. The first support member can deform resiliently up and down. The second support member supports the second supported member mounted on the other side of the specimen holder. The second support member can be adjusted in position up and down. The refrigerant vapor-discharging device expels refrigerant vapor evaporated from the pot.

The above-cited JP-A-2007-26815 describes a cooling cylinder supported in a given installation position inside an electron optical column for a charged particle beam, a top-entry specimen stage, a holder-tilting shaft extending through the electron optical column horizontally, and a stage-tilting rotary member. The cooling cylinder has a stage installation hole coaxial with the optical axis of the charged particle beam. The cooling cylinder has a refrigerant-filled pot mounted in an upper outer portion. The specimen stage has a stage-rotating shaft and a holder installation member to which the specimen holder is detachably mounted. The stage-rotating shaft is mounted under the stage installation hole and supported so as to be rotatable about a horizontal axis. As the stage-rotating shaft rotates, the holder installation member rotates. The inner end of the holder-tilting shaft is coupled to the stage-rotating shaft. The stage-tilting rotary member rotates the holder-tilting shaft about its axis to tilt the holder-tilting shaft, the stage-rotating shaft coupled to the holder-tilting shaft, and the specimen stage.

It is desired to form a solid lubricative coating on each sliding portion of the worm wheel 23a of the rotary disk 23 and the worm gear 24 in mesh with each other. The solid lubricative coating can be made of a fluororesin or Dry Lube (product name).

Such solid lubricative coatings do not freeze even at cryogenic temperatures unlike the case where the worm wheel 23a and worm gear 24 are made of oil-impregnated metal. The solid lubricative coatings assure good lubrication between the worm wheel 23a and worm gear 24 at cryogenic temperatures. Formation of the solid lubricative coatings prevents generation of dust that would normally be caused by sliding motion between the worm wheel 23a and worm gear 24. In addition, vibrations and noises can be prevented.

Figure 5:
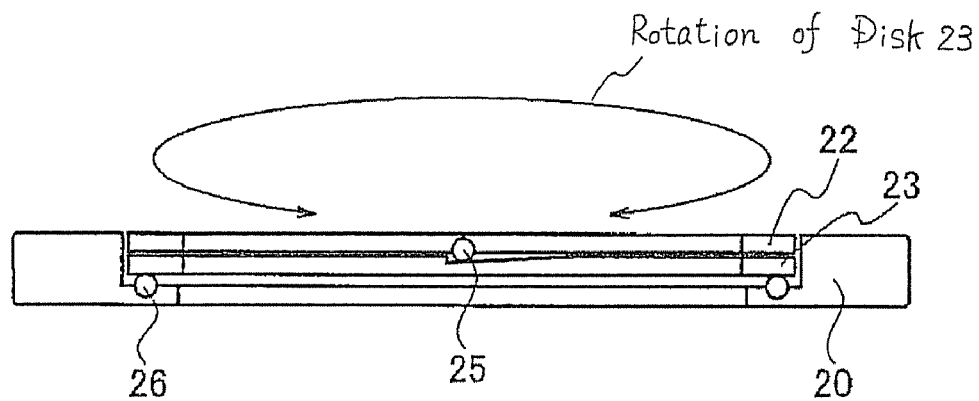
FIG. 5 is a conceptual view of the Z-motion mechanism.
Figure 6:
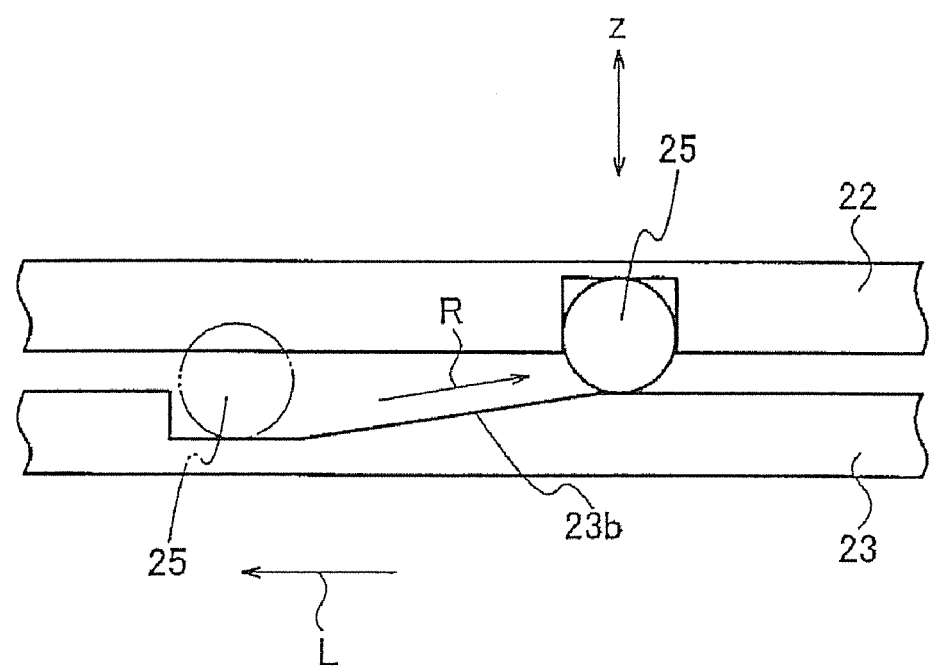
FIG. 6 is a schematic enlarged view of a mechanism used when the Z-motion mechanism moves in the Z-direction.

The operation of the Z-motion mechanism 15 is next described by referring to the above-cited FIGS. 2, 3, 4, 5, and 6. FIG. 5 is a conceptual view of the Z-motion mechanism 15. FIG. 6 is a schematic enlarged view of the mechanism used for movement in the Z-direction. The worm gear 24 is rotated using the motor 35 shown in FIG. 2 via the laminated spring 32 and thermally isolated pipe 31. Rotation of the motor 35 introduced by the rotation introduction shaft 33 is transmitted to the worm gear 24 via the laminated spring 32 and thermally isolated pipe 31. Since the teeth 24a of the worm gear 24 are kept in mesh with the teeth 23a of the rotary disk 23, rotation of the motor 35 rotates the rotary disk 23. Tapering surfaces 23b are formed on the rotary disk 23. Therefore, when the rotary disk 23 rotates in the direction indicated by the arrow L, the balls 25 pass onto the tapering surfaces 23b formed on the rotary disk 23. That is, the balls move in the direction indicated by the arrow R. Consequently, the elevatable disk 22 moves in the Z-direction as indicated by the arrow Z.

That is, the balls 25 pass onto the three tapering surfaces 23b of the rotary disk 23 schematically shown in FIG. 3. The rotary disk 23 is rotated via the worm gear 24. In consequence, the balls 25 go upward along the tapering surfaces 23b. This pushes the overlying elevatable disk 22 in the upward direction, i.e., the Z-direction. Therefore, the specimen stage 13 is pushed upward in the Z-direction.

As described so far, the cryogenic electron microscope D having the structure shown in FIG. 1 moves the specimen stage 13 by the XY-motion mechanism 14 in the X- or Y-direction. In addition, the microscope can move the specimen in the Z-direction by the Z-motion mechanism 15. Moreover, the microscope can tilt the stage 13 by the tilt mechanism 37.

That is, the microscope is equipped with the Z-motion mechanism and, therefore, enables tomography even in a charged-particle beam system equipped with a cryogenic top-entry specimen stage, the tomography being a technique of reconstructing a three-dimensional internal structure of the specimen by tilting the specimen continuously, taking multiple projection images, and image-processing the images by a computer.

Figure 7:
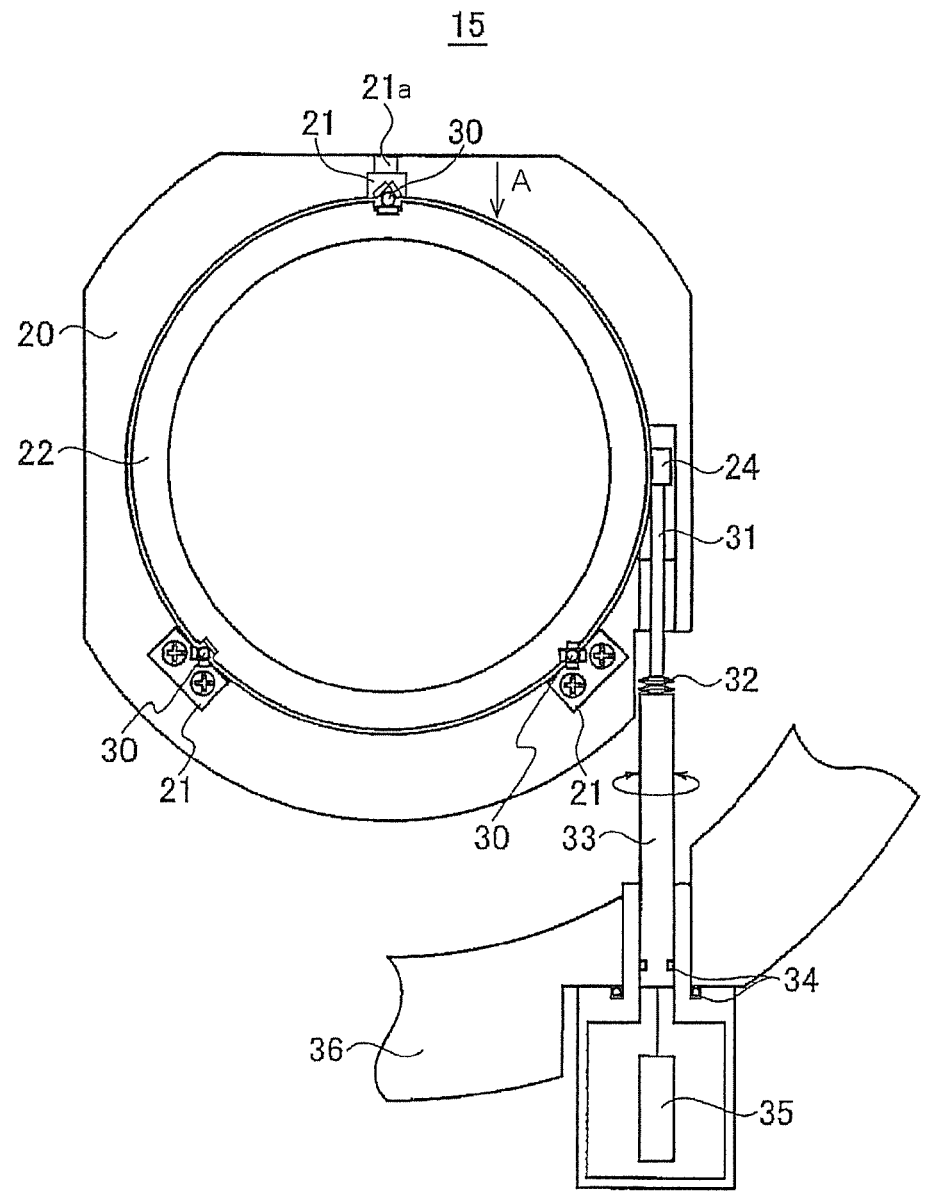
FIG. 7 is a top view of other example of a set of XY-motion mechanism and Z-motion mechanism.

In the above-described embodiment of the specimen stage-moving device for use in a charged-particle beam system, the number of the balls 30 for setting the center axis of the elevatable disk 22 (i.e., the center axis of the specimen stage 13) is three. The balls 30 are held between the elevatable disk 22 and the block 21 held to the support plate 20 for the XY-motion mechanism. One of the three balls 30 may be pre-biased toward the elevatable disk 22 as shown in FIG. 7. That is, in FIG. 7, one of the three balls 30 is pre-biased toward the elevatable disk 22 as indicated by the arrow A by a pre-loading spring 21a via the block 21.

By pre-biasing one of the three balls 30 toward the elevatable disk 22 in this way, if the temperature varies, it is possible to prevent formation of a minute gap between the elevatable disk 22 and each ball 30.

In these elevatable disk 22 and balls 30, the first ball pre-biased toward the elevatable disk 22 is located between the V-groove in the block 21 and the flat portion of the side surface of the elevatable disk 22 and makes a three-point contact. The second ball is located between the V-groove in the block 21 and the flat portion of the side surface of the elevatable disk 22 and makes a three-point contact. The third ball is located between the V-groove in the block 21 and the V-groove in the side surface of the elevatable disk 22 and makes a four-point contact.

Figure 8:
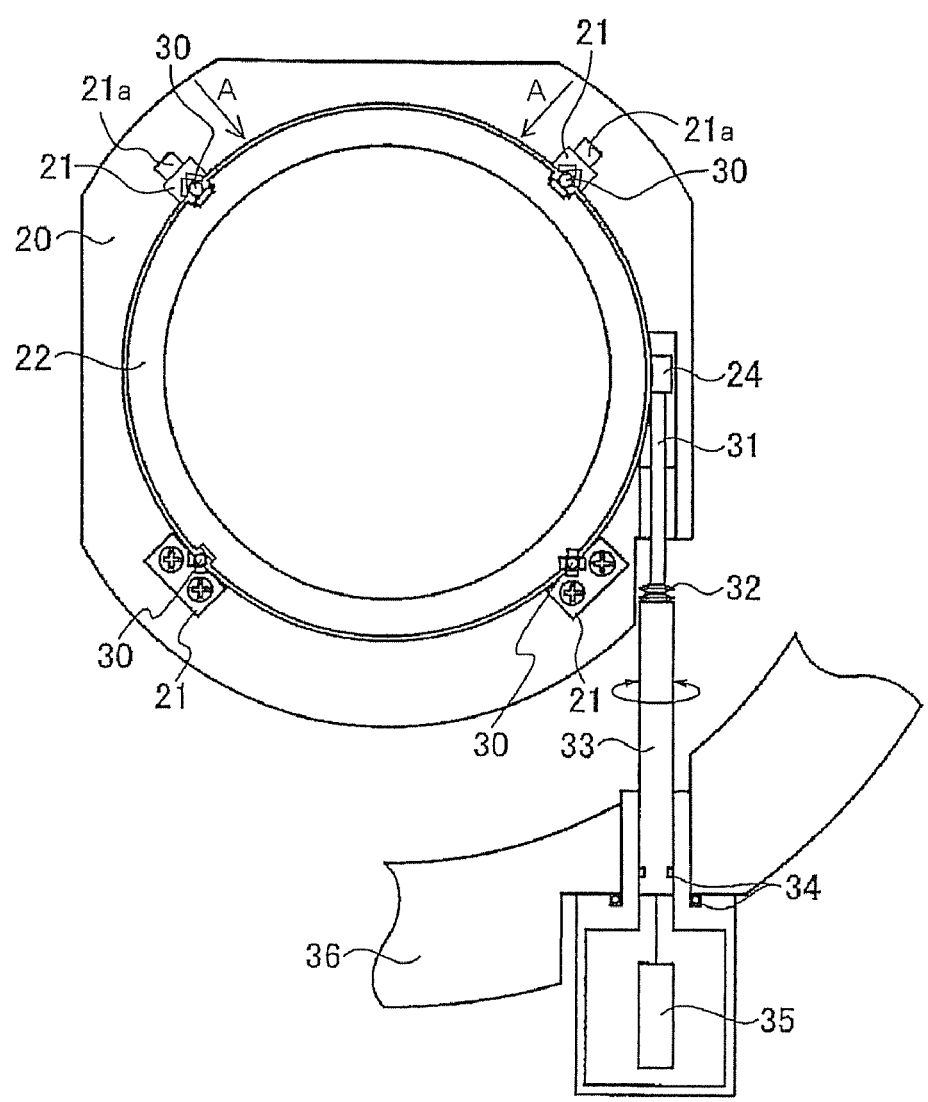
FIG. 8 is a top view of a further example of a set of XY-motion mechanism and Z-motion mechanism.

The number of the balls 30 for setting the center axis of the elevatable disk 22 may be greater than three, e.g., four as shown in FIG. 8. As shown in FIG. 8, two of the four balls 30 are preferably pre-biased toward the elevatable disk 22. That is, in FIG. 8, two of the four balls 30 are pre-biased toward the elevatable disk 22 as indicated by the arrow A via the block 21 by their respective pre-loading springs 21a. Also, in this case, if the temperature varies, it is possible to prevent formation of a minute gap between the elevatable disk 22 and each ball 30.

In these elevatable disk 22 and balls 30, the first ball that is one of the balls pre-biased toward the elevatable disk 22 is located between the V-groove in the block 21 and the flat portion of the side surface of the elevatable disk 22 and makes a three-point contact. The second ball that is the other of the balls pre-biased toward the elevatable disk 22 is located between the V-groove in the block 21 and the flat portion of the side surface of the elevatable disk 22 and makes a three-point contact. The third ball is located between the V-groove in the block 21 and the flat portion of the side surface of the elevatable disk 22 and makes a three-point contact. The fourth ball is located between the V-groove in the block 21 and the V-groove in the side surface of the elevatable disk 22 and makes a four-point contact.

A second embodiment of the specimen stage-moving device which is built according to the present invention and which is for use in a charged-particle beam system is next described. The second embodiment is also a cryogenic electron microscope for observing a specimen under the condition where the specimen is cooled cryogenically. A top-entry type is adopted.

Figure 9:
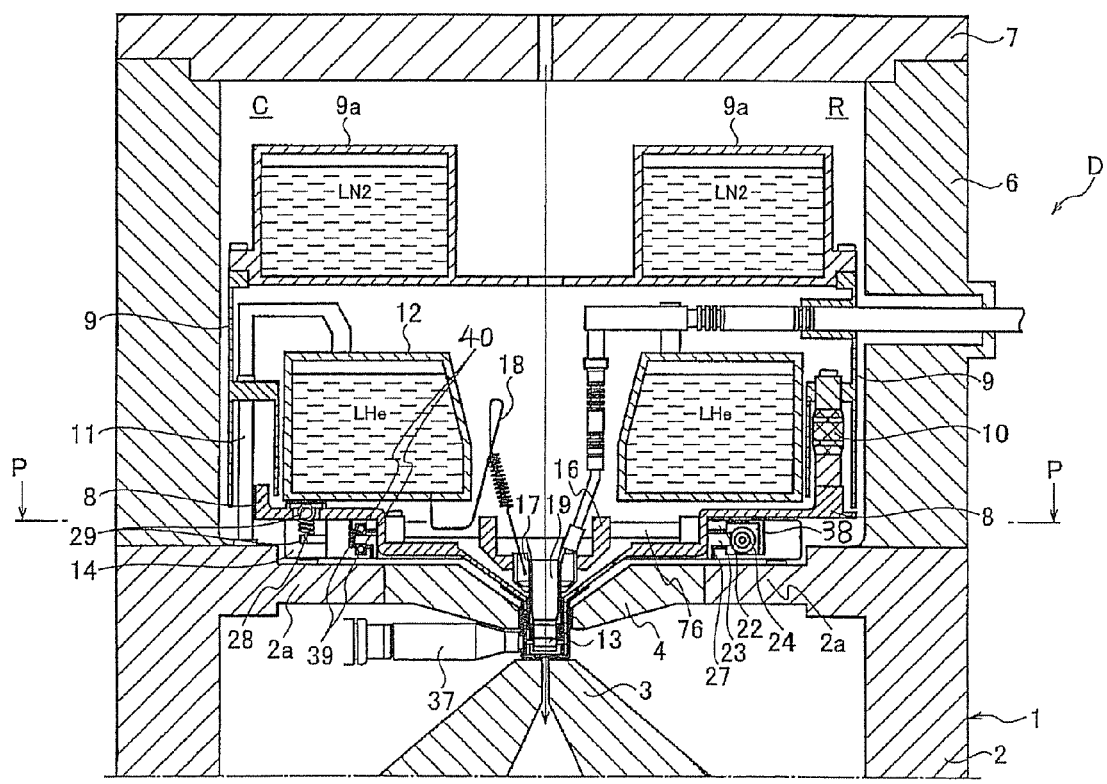
FIG. 9 is a cross-sectional view of main portions of a cryogenic electron microscope forming a second embodiment.

FIG. 9 is a cross-sectional view of main portions of the cryogenic electron microscope of the second embodiment. The second embodiment is similar to the first embodiment except that rollers which can be rotated by a Z-motion mechanism 38 are used instead of the nonrotatable balls used to permit the Z-motion mechanism 15 in the first embodiment to create a plane. The rollers are referred to as rolling members.

Figure 10:
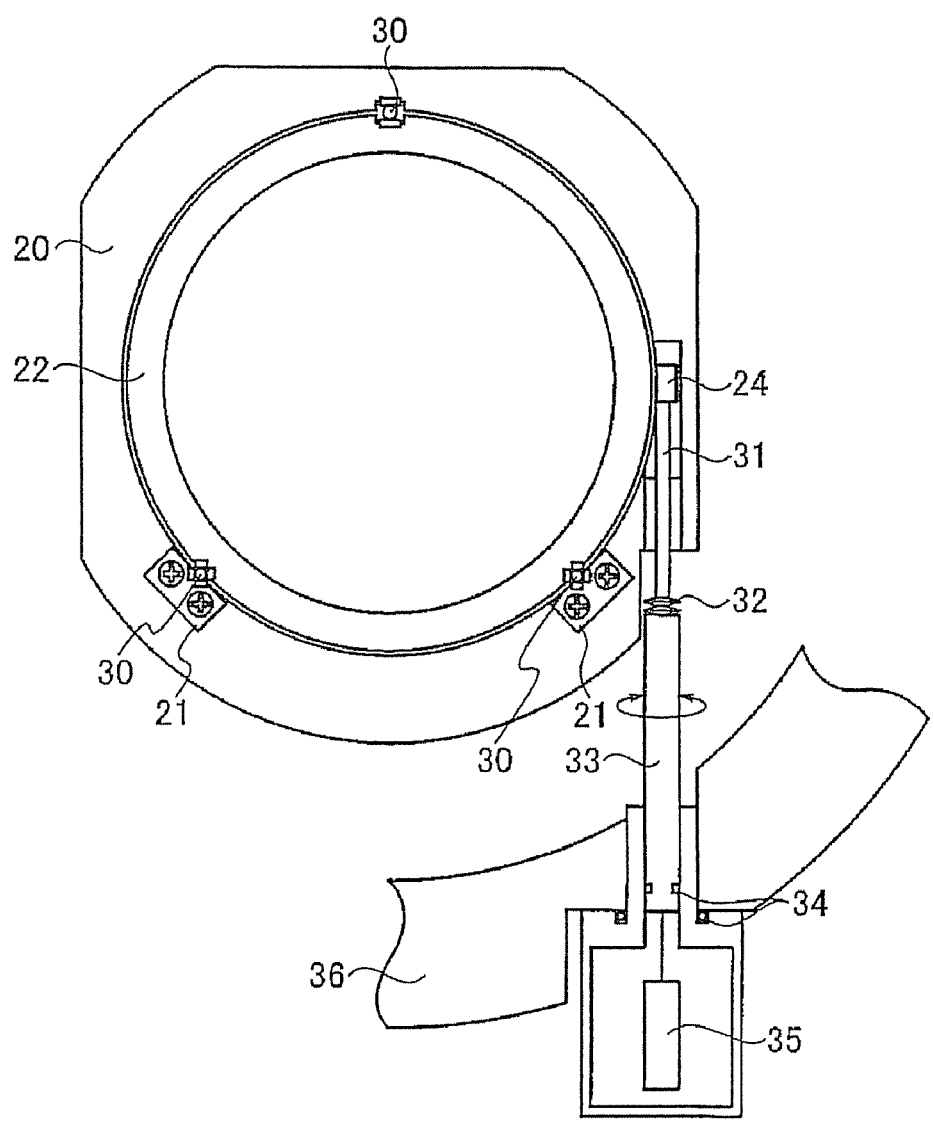
FIG. 10 is a top view of the XY-motion mechanism and Z-motion mechanism shown in FIG. 9.

As shown in FIGS. 9 and 10, the Z-motion mechanism 38 has elevatable disk 22, rotary disk 23, and worm gear 24. Furthermore, the Z-motion mechanism includes rollers 39, shafts 40 for supporting the rollers, and bearings 27. The elevatable disk 22 is coupled to the thermal shield member 8.

As shown in FIG. 3, the rotary disk 23 is toothed to form teeth 23a kept in mesh with the teeth 24a of the worm gear 24. The top surface of the rotary disk 23 is machined to have three similar tapering surfaces 23b. In the second embodiment, the rollers 39 are used instead of the balls 25 and 26 shown in FIG. 3.

The bearings 27 are coupled to the support plate 20 for the XY-motion mechanism. The center axes of the bearings are set on the charged-particle beam shown. The center axis of the rotary disk 23 is set via the bearings 27.

The rollers 39 are supported by the shafts 40 for support of the rollers and rotated. Three of the rollers 39 are located on the top surface of the rotary disk 23, while the other three are located on the bottom surface. Each roller 39 is in point contact or line contact with the rotary disk 23 and acts to provide thermal insulation. Because the rollers 39 are in contact with the rotary disk 23 in three points or three lines, the disk 23 creates an ideal horizontal plane. The rollers 39 are in contact with the three tapering surfaces 23b of the rotary disk 23 in three points or three lines. Similarly, the elevatable disk 22 creates an ideal horizontal plane. This horizontal plane causes the thermal shield member 8 to create a horizontal plane via the elevatable disk 22. That is, the specimen surface is kept parallel to the disks 20, 22, and 23 but perpendicular to the charged-particle beam.

In FIG. 10, the balls 30 are used to set the center axis of the elevatable disk 22. The support plate 20 for the XY-motion mechanism is coupled to the block 21 as mentioned previously. The center axis of the elevatable disk 22 can be set by finely adjusting the block 21.

Referring also to FIG. 10, the thermally insulated pipe 31 is coupled to the worm gear 24 and connected with the shaft 33 via the laminated spring 32. The shaft 33 introduces rotation of the motor 35 mounted outside the electron optical column 36 of the electron microscope D. When the specimen stage is moved in the X- or Y-direction, the laminated spring 32 permits the specimen stage to move flexibly and enables introduction of the rotation. A vacuum seal 34 is mounted in the portion connected with the external motor 35 to maintain the vacuum state inside the electron optical column 36.

The transmission cryo-electron microscope D has a tilt mechanism 37 for tilting the specimen stage 13. The specimen under a tilted state can be observed. The tilting can be done by the tilt mechanism 37 by adopting the technique described in the above-cited JP-A-2002-134053 and JP-A-2007-26815.

Figure 11:
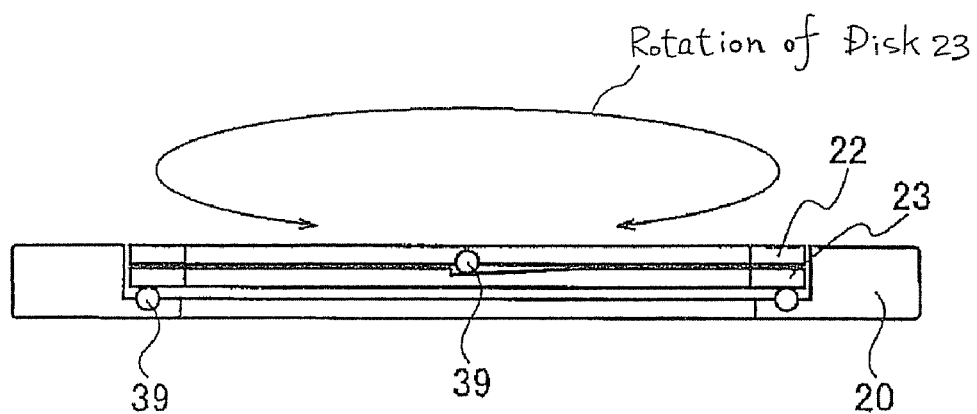
FIG. 11 is a conceptual view of the Z-motion mechanism.
Figure 12:
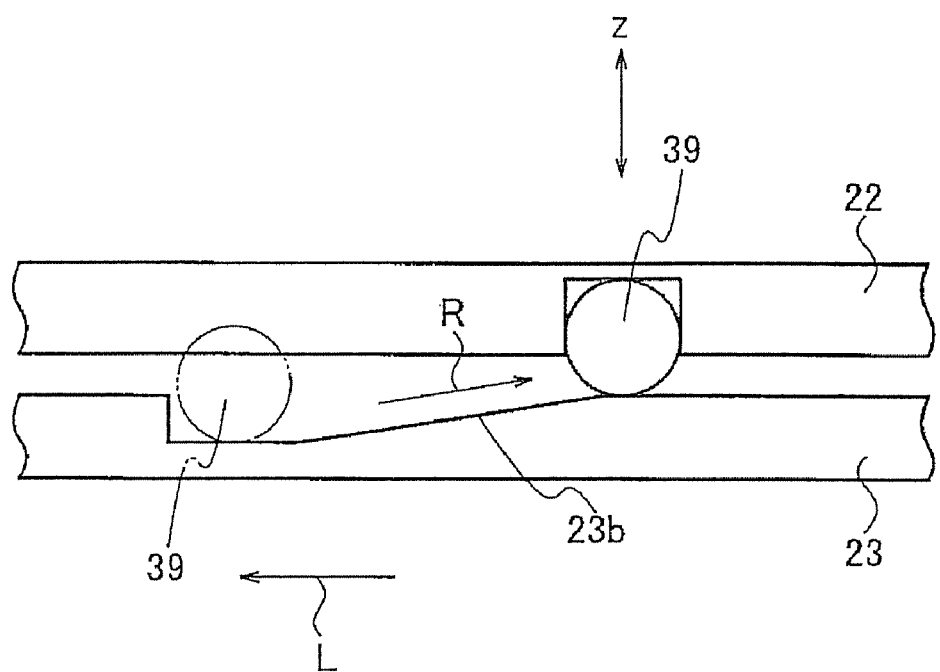
FIG. 12 is a schematic enlarged view of a mechanism used when the Z-motion mechanism moves in the Z-direction.

The operation of the Z-motion mechanism 38 is next described by referring to FIGS. 11 and 12. FIG. 11 is a conceptual view of the Z-motion mechanism 38. FIG. 12 is a schematic enlarged view of the mechanism used for movement in the Z-direction. The worm gear 24 is rotated by the motor 35 shown in FIG. 10 via the laminated spring 32 and thermally isolated pipe 31. Rotation of the motor 35 introduced by a rotation introduction shaft 33 is transmitted to the worm gear 24 via the laminated spring 32 and thermally isolated pipe 31. Since the teeth of the worm gear 24 are kept in mesh with the teeth of the rotary disk 23, rotation of the motor 35 rotates the rotary disk 23. Tapering surfaces 23b are formed on the rotary disk 23. Therefore, when the rotary disk 23 rotates in the direction indicated by the arrow L, the rollers 39 pass onto the tapering surfaces 23b formed on the rotary disk 23. That is, the rollers move in the direction indicated by the arrow R. Consequently, the elevatable disk 22 moves in the Z-direction as indicated by the arrow Z.

As described so far, the cryogenic electron microscope D of the second embodiment of the structure shown in FIG. 9 can move the specimen stage 13 in the X- or Y-direction by means of the XY-motion mechanism 14. In addition, the microscope can move the stage in the Z-direction by means of the Z-motion mechanism 38. Furthermore, the microscope can tilt the specimen stage 13 by means of the tilt mechanism 37.

That is, the microscope is equipped with the Z-motion mechanism and, therefore, enables tomography even in a charged-particle beam system equipped with a cryogenic top-entry specimen stage, the tomography being a technique of reconstructing a three-dimensional internal structure of a specimen by tilting the specimen continuously, taking multiple projection images, and image-processing the images by a computer.

Rotatable balls, bearings, or other rolling members may be used instead of the rollers 39. The rotatable balls or bearings pass onto the tapering surfaces 23b of the rotary disk 23 and move in the Z-direction in the same way as the rollers 39.

A third embodiment of the specimen stage-moving device built according to the present invention and for use in a charged-particle beam system is next described. The third embodiment is also a cryogenic electron microscope for observing a specimen under the condition where the specimen is cooled cryogenically. A top-entry type is adopted.

The cryogenic electron microscope of the third embodiment is fundamentally identical in structure with the first and second embodiments. Therefore, a cross-sectional view of main portions is omitted.

Figure 13:
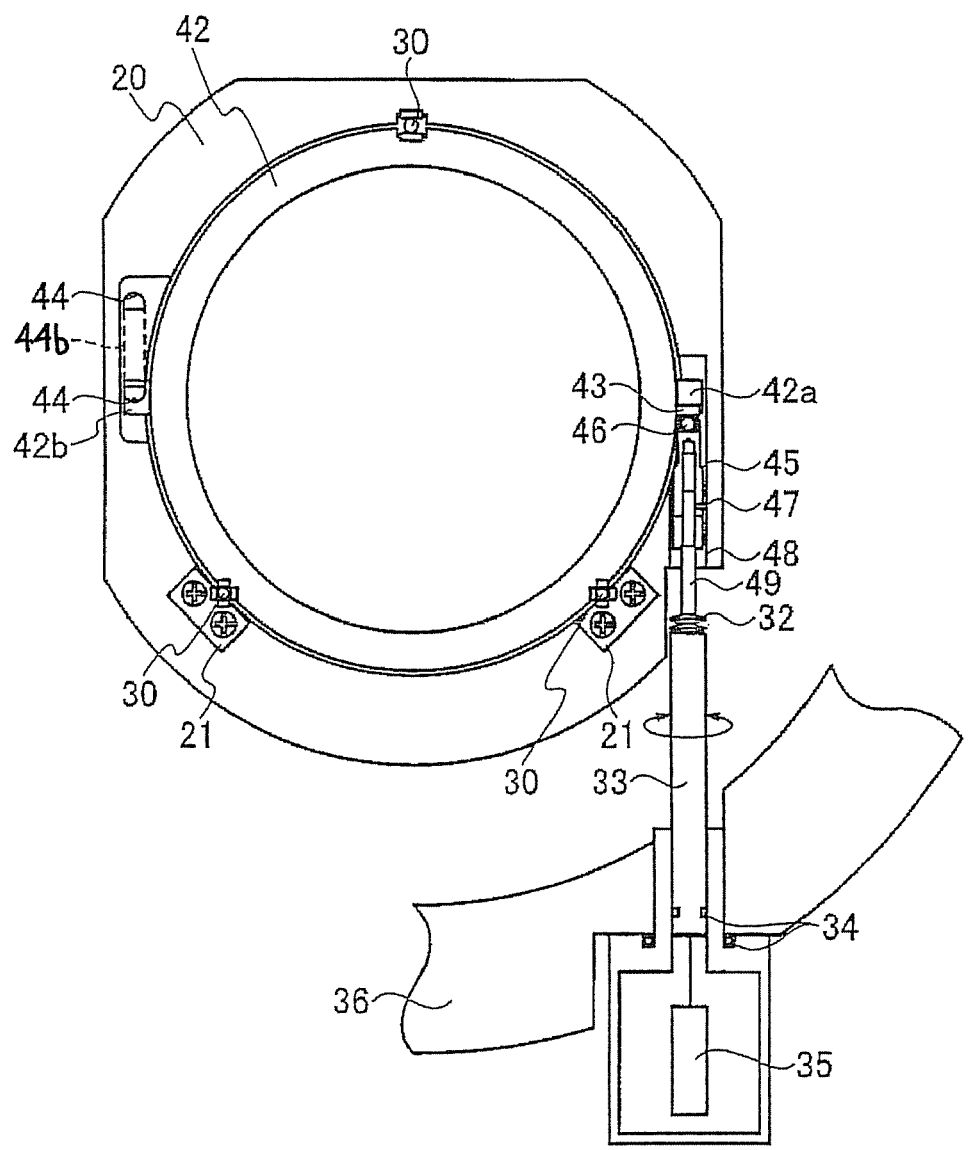
FIG. 13 is a top view of a charged-particle beam system equipped with a cryogenic specimen stage having a Z-motion mechanism.

FIG. 13 is a top view of a charged-particle beam system equipped with a cryogenic specimen stage having a Z-motion mechanism. A disk 42 corresponding to the rotary disk 23 of the first and second embodiments is not toothed but has blades 42a and 42b protruding from the right and left sides of the body of the disk. The top surface of the disk 42 is machined to form three similar tapering surfaces. A bushing 43 for receiving a ball 46 is mounted to the right side of the body of the disk. A pin 44 on which a spring 44b is caught is mounted to the left side of the body of the disk. The ball 46 is attached to a nut 45 and has a threaded hole. A guiding pin 47 for converting rotary motion into linear motion stands upright from the nut 45. A groove is formed in a guide member 48. Motion of the pin 47 is restricted by the groove, and the pin 47 does not rotate. A thermally insulated pipe 49 is threaded. The thread is coupled to the nut 45 in the bolt and nut relationship. The spring 44b is anchored to pins which are secured to the support plate 20 for the XY-motion mechanism and to the nut 45, respectively.

Figure 14:
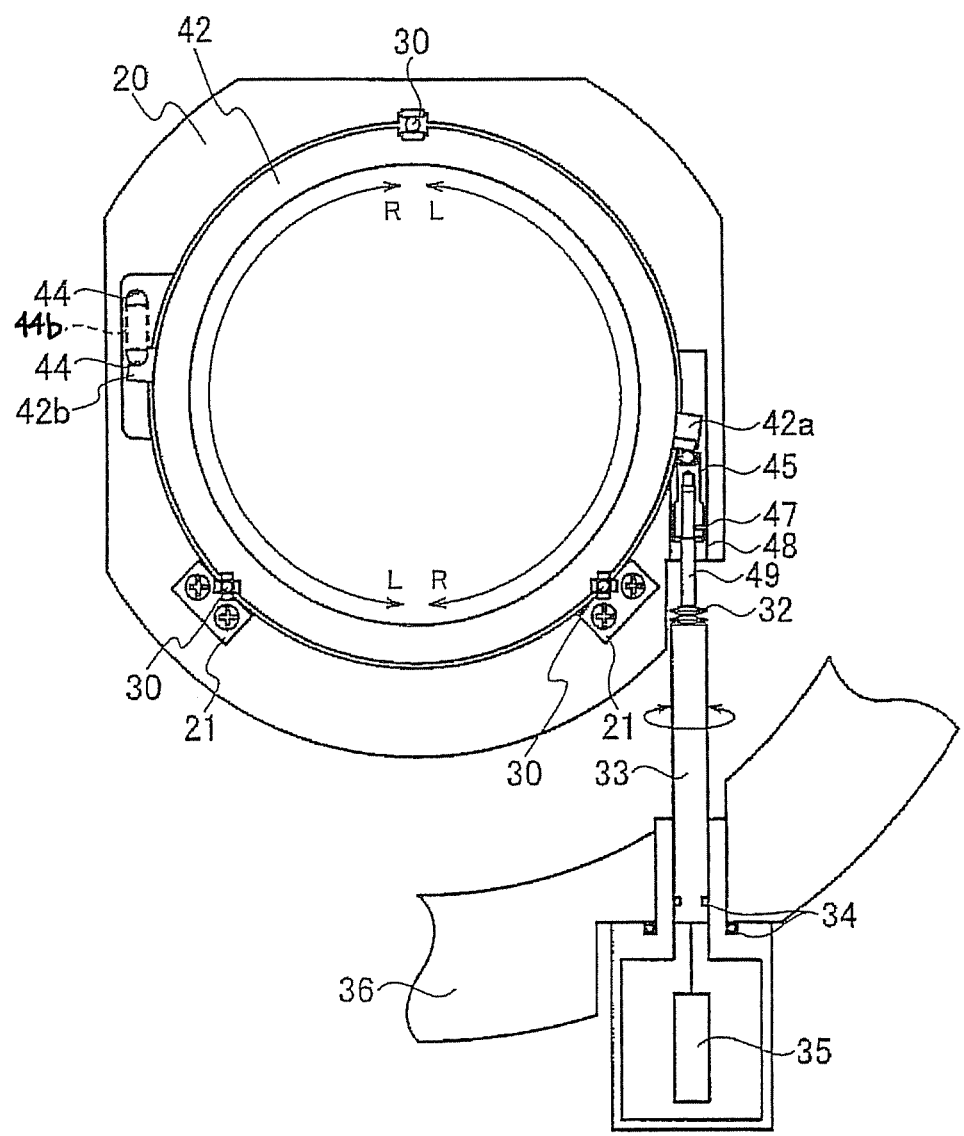
FIG. 14 is a view similar to FIG. 13, but illustrating the operation of the charged-particle beam system.

The operation of the third embodiment is described. FIG. 14 illustrates the manner in which the disk 42 is rotating. First, the shaft 33 for introduction of rotation is rotated using the motor 35. At this time, the laminated spring 32 and thermally insulated pipe 49 also rotate. The thermally insulated pipe is threaded. The thread is coupled to the nut 45 in the bolt and nut relationship. When the thermally insulated pipe 49 rotates, the nut 45 is moved rectilinearly by feeding of the thread. To permit the rectilinear motion, it is necessary to restrict rotary motion of the nut 45. For this purpose, the guiding pin 47 is mounted upright. A groove is formed in the guide member 48. The pin 47 is restricted by the groove and does not rotate. Consequently, the nut 45 can move rectilinearly.

The spring 44b exerts a force to pull the disk 42 in a clockwise direction R at all times. When the nut 45 is driven in the downward direction as viewed in the figure, the disk 42 rotates in the clockwise direction R. When the disk is pushed in by the nut 45, the disk 42 rotates in the counterclockwise direction L.

The principle on which the balls pass onto the tapering surfaces when Z-motion is made is the same as in the first and second embodiments.

In this way, the third embodiment is equipped with the Z-motion mechanism and, therefore, enables tomography even in a charged-particle beam system equipped with a cryogenic top-entry specimen stage, the tomography being a technique of reconstructing a three-dimensional internal structure of a specimen by tilting the specimen continuously, taking multiple projection images, and image-processing the images by a computer.

A fourth embodiment of the specimen stage-moving device which is built according to one embodiment of the present invention and which is for use in a charged-particle beam system is next described. The fourth embodiment is also a cryogenic electron microscope for observing a specimen under the condition where the specimen is cooled cryogenically. A top-entry type is adopted.

Figure 15:
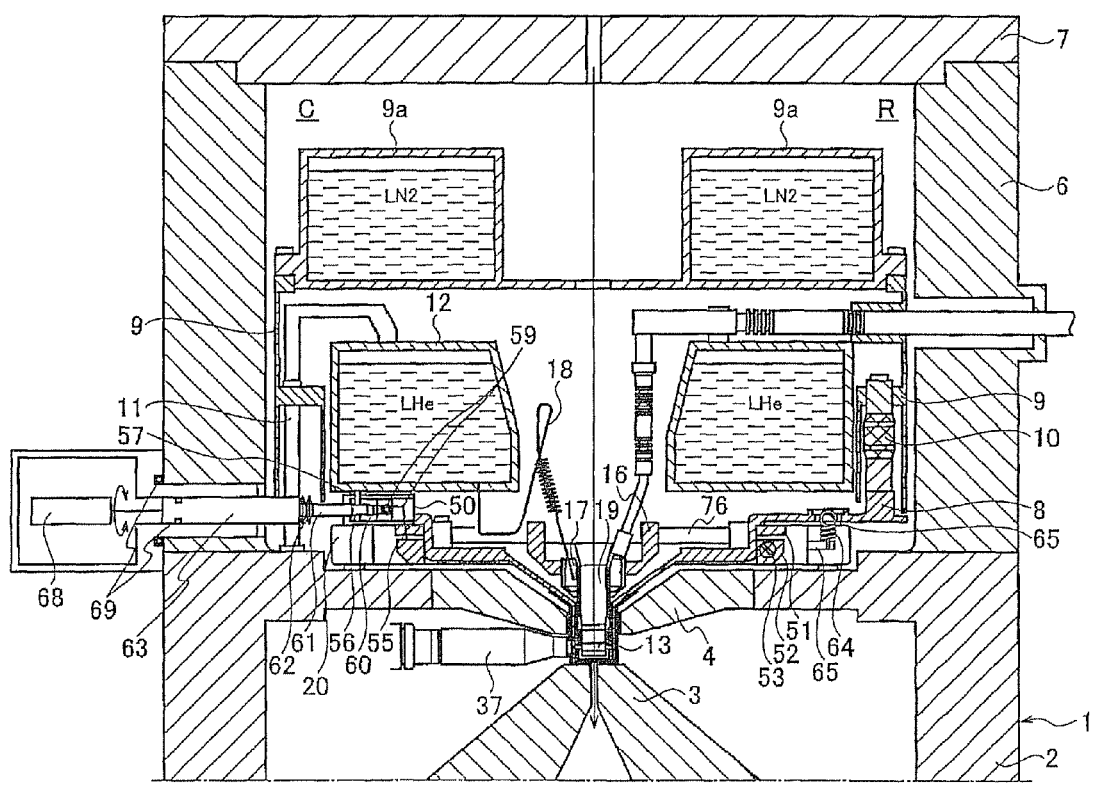
FIG. 15 is a cross-sectional view of main portions of a cryogenic electron microscope forming a fourth embodiment.

FIG. 15 is a cross-sectional view of main portions of the cryogenic electron microscope of the fourth embodiment. The microscope is generally indicated by D. An objective lens 1 forms a part of the microscope D, and has a yoke 2, a bottom polepiece 3, and a top polepiece 4. The bottom polepiece 3 is formed integrally with a central portion of the yoke 2. The top polepiece 4 is formed integrally with an upper part of the yoke 2 that is located over the bottom polepiece 3.

The transmission electron microscope D has a cylindrical outer wall 6 that is integrally coupled to the side wall of the yoke 2 above the yoke 2. A partition wall 7 is connected to the upper end of the outer wall 6. A specimen chamber R that is maintained as a vacuum is formed inside the outer wall 6 and partition wall 7.

A specimen-cooling device C has a cylindrical thermal shield member 8 that is disposed in the specimen chamber R. A disk-like thermal shield cooling member 9 is connected with the upper end of the thermal shield member 8 via a braided wire 10 made of a thermally conductive material. A tank 9a in which liquid nitrogen LN2 is stored is mounted on the upper end of the thermal shield cooling member 9. Because the liquid nitrogen LN2 stored in the tank 9a cools the thermal shield cooling member 9, the cooling temperature is almost transmitted to the thermal shield member 8 via the braided wire 10. The thermal shield member 8 is cooled to a similar extent.

An annular liquid helium tank 12 is held inside the thermal shield cooling member 9 via plural thermally insulated pipes (only one is shown in FIG. 15) 11. Liquid helium LHe is stored in the liquid helium tank 12.

An XY-motion mechanism 14 for moving the top-entry specimen stage 13 in the X- and Y-directions and a Z-motion mechanism 50 for moving the specimen stage 13 in the Z-direction perpendicular to the XY-plane are mounted on the top surface of the portion 2a of the yoke 2 located under the liquid helium tank 12. The position of the specimen stage 13 can be adjusted such that the stage can be moved in the Z-direction as well as in the X- and Y-directions. The XY-motion mechanism 14 and Z-motion mechanism 50 will be described in detail later.

A cooling portion 16 is mounted below the liquid helium tank 12 and has a He pot 17. Liquid helium LHe is supplied into the He pot 17 from a capillary 18 connected with the liquid helium tank 12. The cooling portion 16 has a cylindrical holder installation hole 19 inside the He pot 17. The specimen stage 13 is held inside the hole 19.

The thermal shield member 8 is coupled to the He pot 17 located inside the cooling portion 16 via a thermally insulated pipe 76. The specimen stage 13 is connected with the front end of the He pot 17 inside the holder installation hole 19. The specimen stage 13 is cooled by the thermal shield member 8 and He pot 17. The XY-motion mechanism 14 is coupled to the thermal shield member 8. That is, as the XY-motion mechanism 14 moves, the specimen on the specimen stage 13 is moved in the X- or Y-direction via the thermal shield member 8 and He pot 17.

The portion of the capillary 18 connected with the He tank 12 which is connected with the He pot 17 is shaped like a coil. When the cooling portion 16 and specimen stage 13 are adjusted in position, their motions are not hindered.

Figure 16:
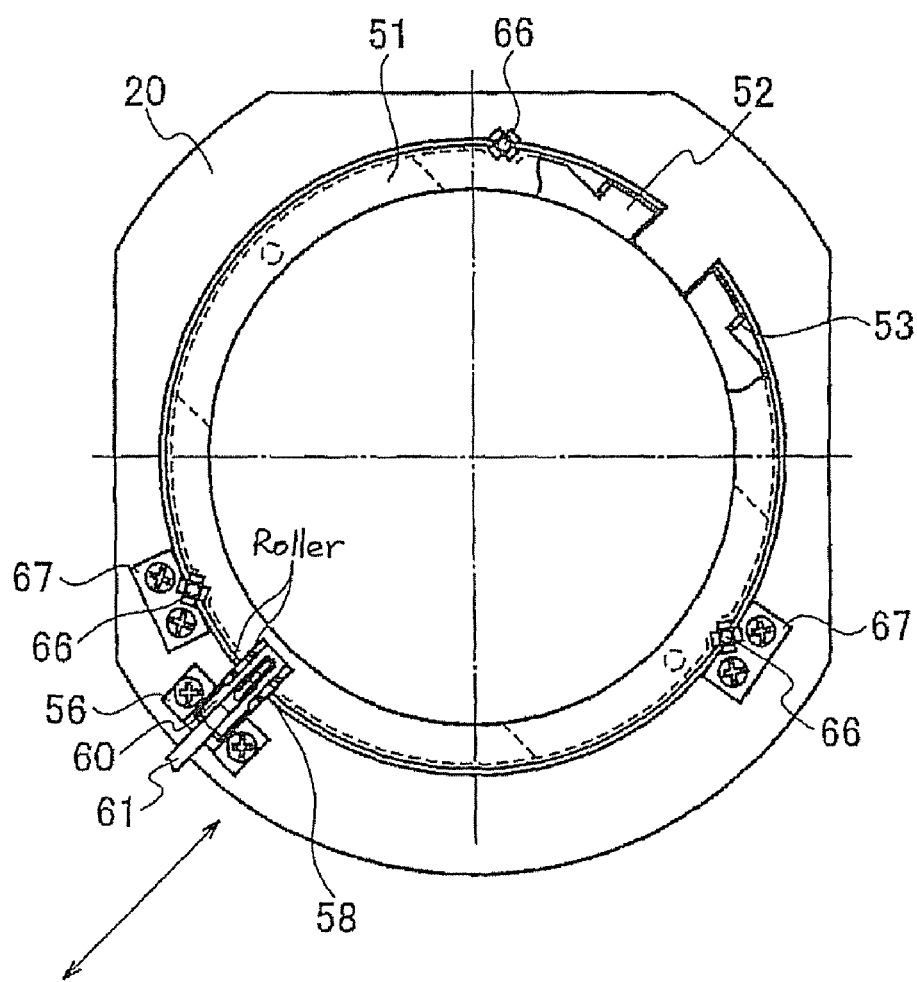
FIG. 16 is a top view of the XY-motion mechanism and Z-motion mechanism shown in FIG. 15.

FIG. 16 is a top view of the XY-motion mechanism 14 (support plate 20 for the XY-motion mechanism) and Z-motion mechanism 50. The XY-motion mechanism 14 moves the specimen stage 13 within the XY-plane. The Z-motion mechanism 50 moves the specimen stage 13 in the Z-direction perpendicular to the XY-plane, using a rotary mechanism.

The Z-motion mechanism 50 has a first disk 51, a second disk 52, and a shaft 53. The first disk 51 is coupled to a thermal shield member 8. Two balls 54 (described later) are coupled to the first disk 51. The second disk 52 is in contact with the first disk 51 via the balls 54 in two points, the balls 54 being coupled to the first disk 51. As shown in the right portion of FIG. 15, the shaft 53 is mounted. The Z-motion mechanism 50 is coupled to the support portion 20 for the XY-motion mechanism via the shaft 53. A screw 55 for connecting a wire is mounted to the left portion shown in FIG. 15. A guide member 56 is coupled to the support plate 20 for the XY-motion mechanism. A groove for guiding a pin 57 is formed in the guide member. A roller 59 to which the wire 58 is anchored is held by the guide member 56. A pin 52 is mounted to a nut 60 and holds the roller 59 to which the wire 58 is anchored. A threaded hole is formed in the nut 60. The nut is coupled to the thermally insulated pipe 61 in the bolt and nut relationship. The thermally insulated pipe 61 is coupled to the rotating-introducing shaft 63 via the laminated spring 62.

The spring 64 for preventing motion in the Z-direction is caught on pins 65 (only one is shown). The pins 65 are mounted respectively to the thermal shield member 8 and the support plate 20 for the XY-motion mechanism. Because the spring is used to hinder motion in the Z-direction, motion in the Z-direction is restricted.

In FIG. 16, balls 66 are used to set the center axis of the first disk 51 on the charged-particle beam shown. The horizontal plane of the first disk 51 is created while setting the center axis by the balls 66. The block 67 is coupled to the support plate 20 for the XY-motion mechanism. The center axis of the first disk 51 can be set by finely adjusting the block 67.

Rotation of the motor 68 is transmitted to the laminated spring 62 by the rotation-introducing shaft 63. A vacuum seal 69 is mounted over the shaft 63 to maintain the internal vacuum because the motor 68 is located outside the electron optical column.

Figure 17:
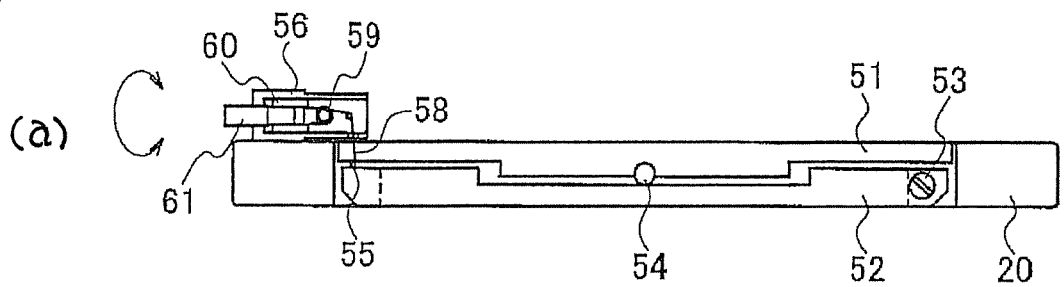
FIGS. 17(a) and 17(b) are conceptual views of the Z-motion mechanism.
Figure 17:
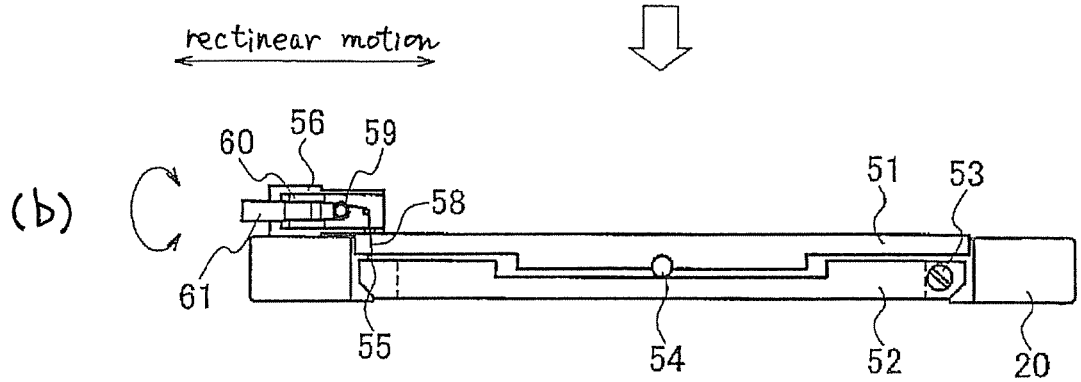
Figure 18:
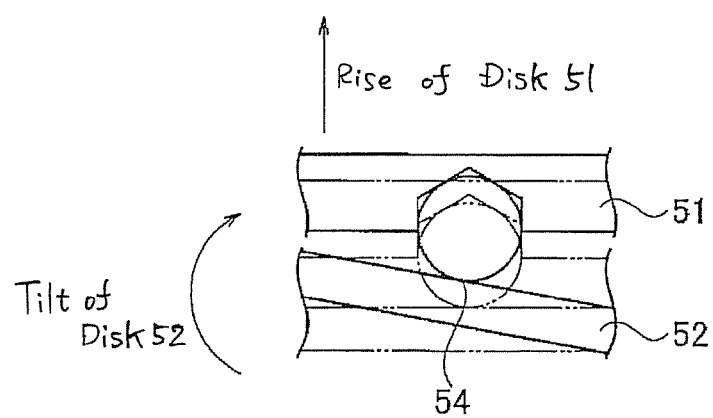
FIG. 18 is a schematic enlarged view of a mechanism used when the Z-motion mechanism moves in the Z-direction.

The operation of the Z-motion mechanism 50 is next described by referring to FIGS. 17 and 18. FIG. 17 is a conceptual view of the Z-motion mechanism 50. FIG. 18 is a schematic enlarged view of the mechanism used for movement in the Z-direction.

Rotation introduced by the motor 68 shown in FIG. 15 turns the thermally isolated pipe 61. The rotated thermally insulated pipe 61 produces a rectilinear motion of the nut 60 in the bolt and nut relationship by feeding of the screw. To permit the rectilinear motion, it is necessary to restrict rotary motion of the nut 60. For this purpose, a pin 57 for guiding purposes is mounted upright. A groove is formed in a guide member 56. The pin 57 is restricted by the groove in the guide member 56 and does not rotate. Consequently, the nut 60 can make a rectilinear motion. Utilizing the rectilinear motion, the wire 58 is pulled or returned to the original state.

At this time, the wire 58 is coupled to the second disk 52 and, therefore, tilts about the shaft 53. The first disk 51 is raised via the balls 54. The first disk 51 ascends parallel while guided by the balls 66. That is, the thermal shield member 8, He pot 17, and specimen stage ascend parallel.

As described so far, the cryogenic electron microscope D having the structure shown in FIG. 15 moves the specimen stage 13 in the X- or Y-direction by the XY-motion mechanism 14. In addition, the microscope can move the specimen stage in the Z-direction by the Z-motion mechanism 50. Moreover, the microscope can tilt the specimen stage 13 by the tilt mechanism 37.

That is, the microscope is equipped with the Z-motion mechanism and, therefore, enables tomography even in a charged-particle beam system equipped with a cryogenic top-entry specimen stage, the tomography being a technique of reconstructing a three-dimensional internal structure of a specimen by tilting the specimen continuously, taking multiple projection images, and image-processing the images by a computer.

With the above-described Z-motion mechanisms 15, 38, and 50, the disk having the tapering surfaces is guided by the bearings for preventing axial misalignment. However, where mechanical machining accuracy and thermal shrinkage of components are taken into account, it is necessary to design their center axes such that backlash is produced. Therefore, the force received from the worm gear for introducing the rotation causes the disk having the tapering surfaces to move a distance corresponding to the backlash of the components. Motion of the disk having the tapering surfaces produces direct effects during observation of the specimen.

The rotating members such as balls, rollers, or bearings that pass onto the tapering surfaces must be placed perpendicularly to the circumferential direction. Therefore, the direction in which each rotating member is installed must be adjustably set.

Figure 19:
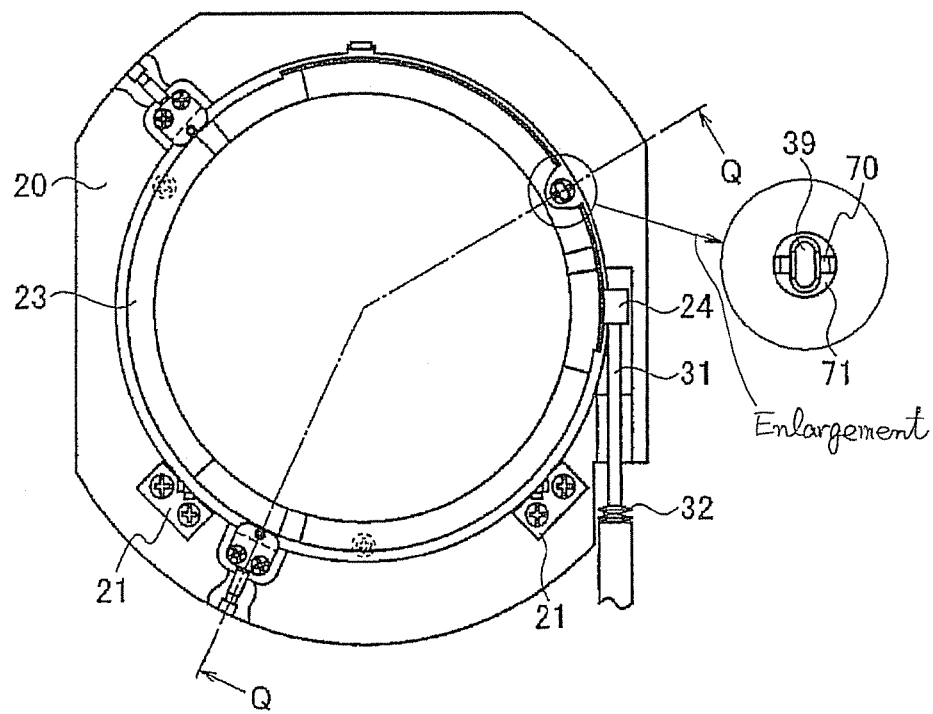
FIG. 19 is a cross-sectional view taken on line P-P of the cross section of the main portions of the cryogenic electron microscope of the second embodiment.
Figure 20:
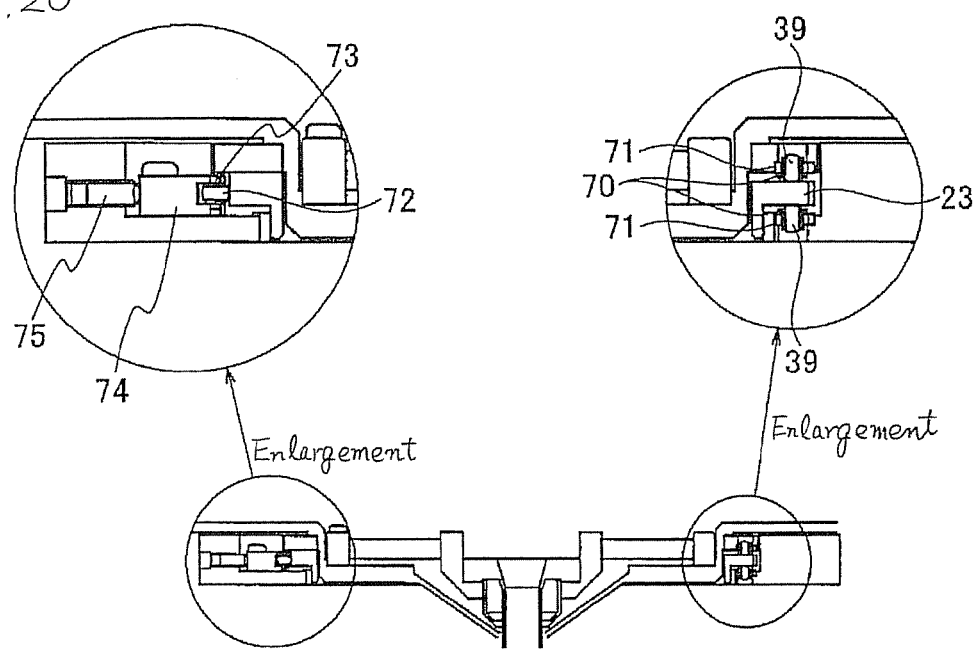
FIG. 20 is a cross section taken along line Q-Q of FIG. 19.
Figure 21:
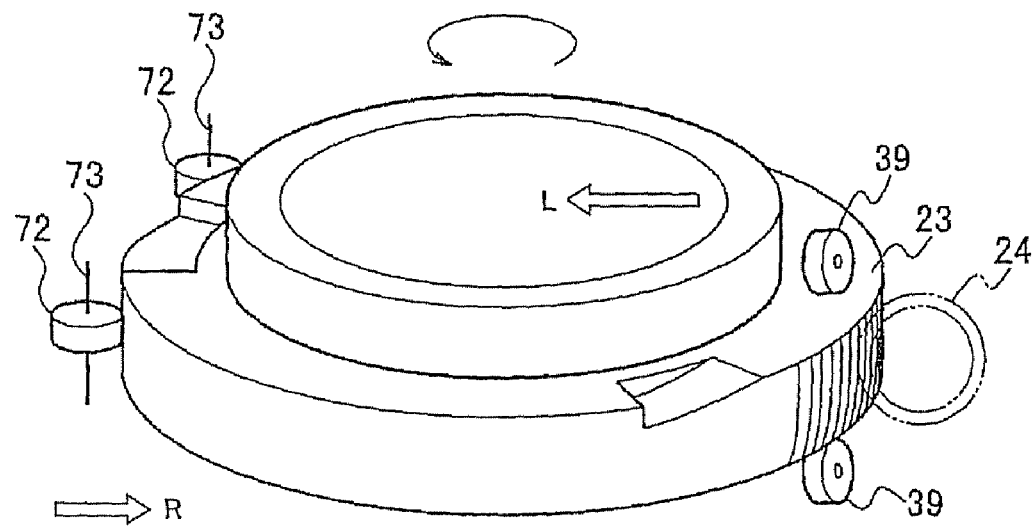
FIG. 21 is a perspective view of a rotary disk and a gear.

A structure for suppressing vibrations due to axial misalignment produced in the Z-motion mechanism 38 shown in FIG. 9 is now described. FIG. 19 is a cross section taken on line P-P of FIG. 9. FIG. 20 is a cross section taken on line Q-Q of FIG. 19. FIG. 21 is a perspective view of the rotary disk 23 and gear 24.

Each roller 39 or bearing is supported by a supportive pin 70, which is coupled to a supporting member 71. The supporting member 71 is cylindrical in shape and can be rotated unless the member is held to the support plate 20 for the XY-motion mechanism and to the elevatable disk 22. After placing the roller 39 or bearing in position such that the direction of rotation of the roller 39 coincides with the direction of rotation of the rotary disk 23, the supporting member 71 is held to the support plate 20 for the XY-motion mechanism and to the elevatable disk 22.

The number of the rollers 39 or bearings is three. Each roller 39 is in line contact with the rotary disk 23 and provides thermal insulation. Since the rollers 39 are in contact with the rotary disk 23 at three points, the bottom surface of the disk 23 creates an ideal horizontal plane. Similarly, the rollers 39 are in contact with the three tapering surfaces of the rotary disk 23 at three points. The elevatable disk 22 similarly creates an ideal horizontal plane. This horizontal plane causes the thermal shield member 8 to create a horizontal plane via the elevatable disk 22. That is, the specimen surface is kept parallel to the support plate 20, elevatable disk 22, and rotary disk 23. The specimen surface is vertical to the charged particle beam.

Meanwhile, each roller 72 or bearing is supported by a supportive pin 73, which is coupled to a support member 74. The rollers 72 or bearings are arranged to guide the circumferential direction of the rotary disk 23. A set screw 75 permitting fine adjustment is mounted to each roller 72 or bearing to pre-bias the rotary disk 23.

Figure 22:
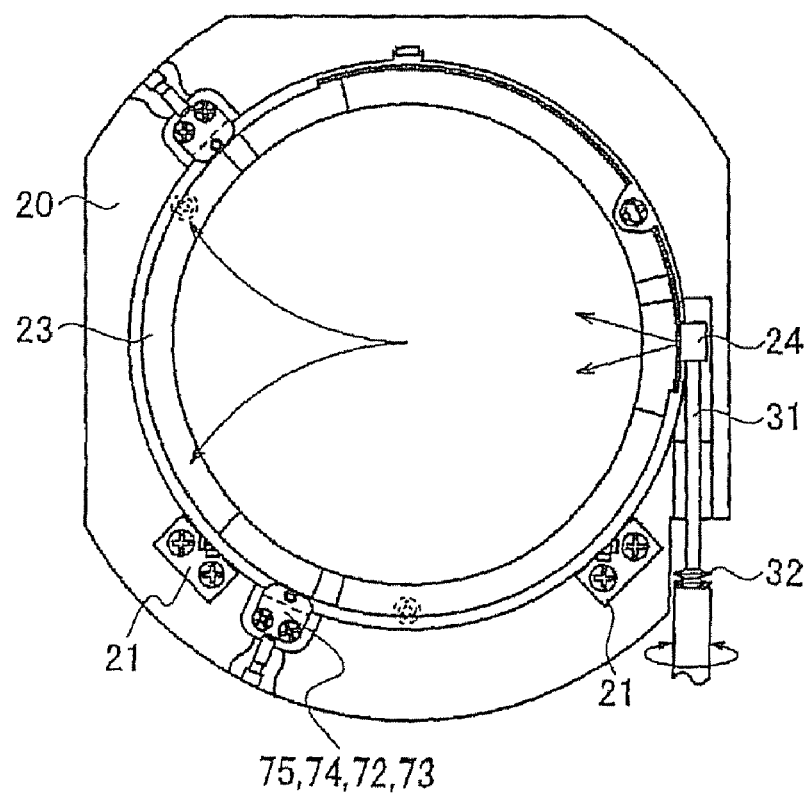
FIG. 22 is a conceptual view of the force received from a worm gear 24.

The operation of the Z-motion mechanism 38 has been already described in connection with FIGS. 11 and 12. FIG. 22 is a conceptual view of the force received from a worm gear 24. When the worm gear 24 rotates, a force acts in the direction of pressure angle of the worm gear 24. Therefore, the rotary disk 23 produces a force acting in the direction of pressure angle. Two rollers 72 or bearings are disposed at different locations to suppress this force. When the rotary disk 23 rotates, the rollers 72 or bearings rotate and act as guiding members while receiving the force. More specifically, as shown in FIG. 21, when the worm gear 24 rotates, the rotary disk 23 is pushed to the left as indicated by the arrow L. This would normally cause axial misalignment. The rollers 72 suppress the motion of the disk 23 to the rightward lateral direction indicated by the arrow R.

Accordingly, the structure described in connection with FIGS. 18-22 can suppress vibrations due to axial misalignment produced when the Z-motion mechanism 38 moves in the Z-direction.

Figure 23:
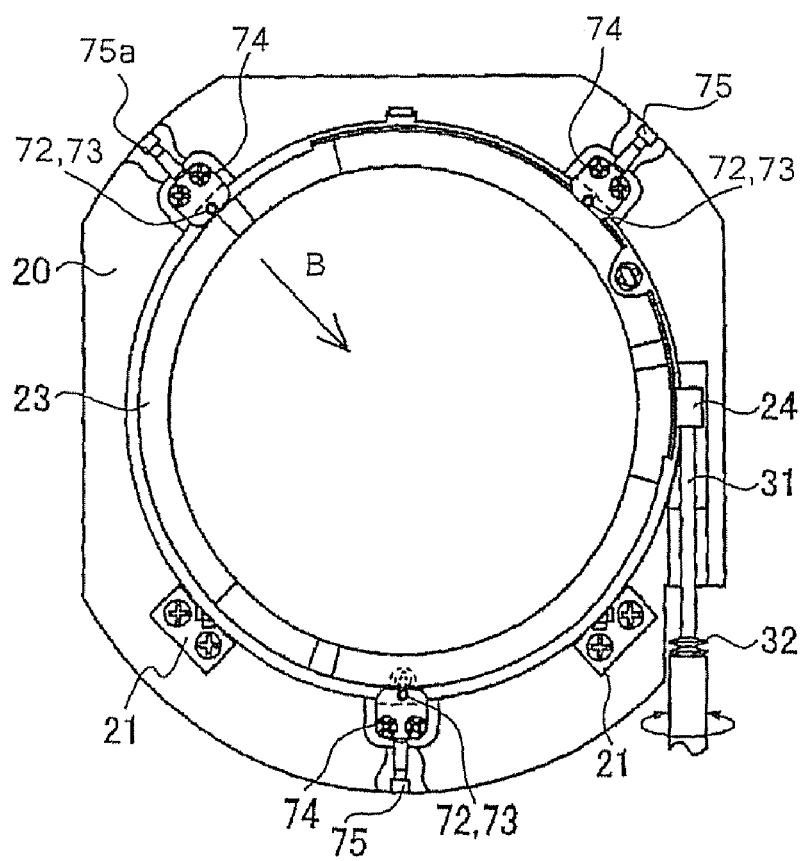
FIG. 23 is a top view of another example of structure that supports the rotary disk.

The center axis of the rotary disk 23 may be set by the rollers 72 or bearings at three locations on the outer surface of the rotary disk 23 such that at least one roller or bearing is placed at each one of the three locations. That is, as shown in FIG. 23, the rollers 72 supported by the supportive pins 73 are mounted at the three locations on the outer surface of the rotary disk 23 to support the disk 23 by the three rollers 72 at three locations. In this case, the roller 72 at one of the three locations is preferably pre-biased toward the rotary disk 23 by a pre-loading spring 75a. The rollers 72 at the other locations can be adjusted in position in the direction to move toward and away from the disk 23 by the set screws 75 for fine adjustment.

If the temperature varies, formation of a minute gap between the rotary disk 23 and each roller 72 can be prevented by supporting the disk 23 by the rollers 72 in the three locations and pre-biasing the roller 72 located at one of the three locations toward the rotary disk 23 in this way as indicated by the arrow B.

Figure 24:
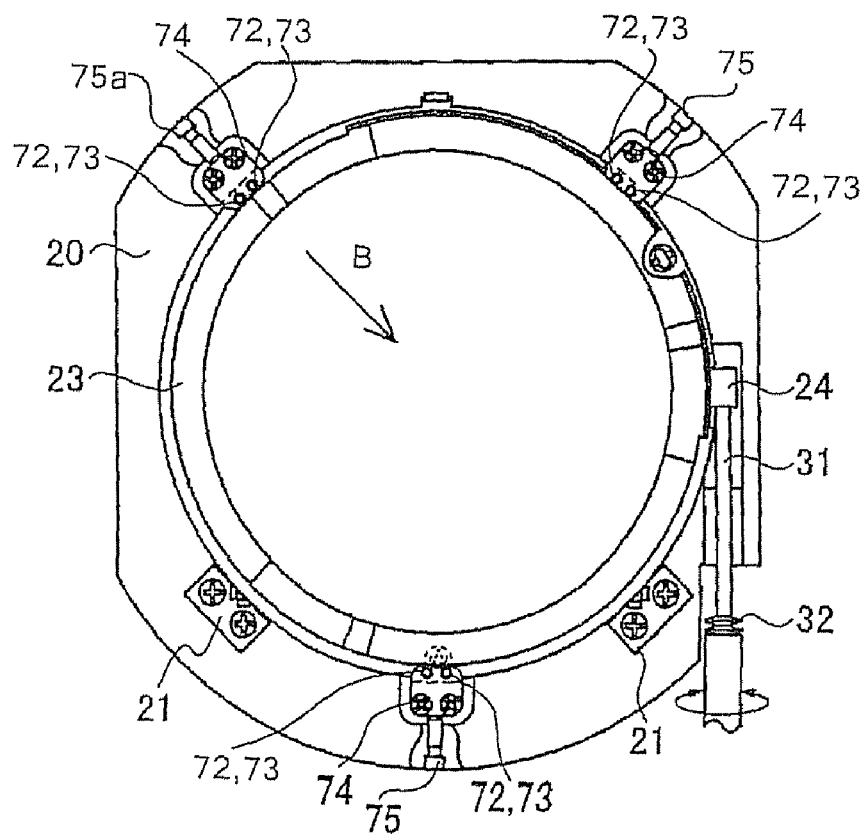
FIG. 24 is a top view of a further example of structure that supports the rotary disk.

Two or more rotating members such as rollers 72 or bearings may be mounted at each of the three locations on the outer surface of the rotary disk 23 to set the center axis of the disk 23. That is, as shown in FIG. 24, a pair of rollers 72 supported by their respective supportive pins 73 is mounted at each of three locations on the outer surface of the rotary disk 23. The disk 23 is supported at the three locations by the six rollers in total. In this case, one pair of rollers 72 at one of the three locations is preferably pre-biased toward the disk 23 by pre-loading springs 75a as indicated by the arrow B. The roller pairs 72 at the other locations can be adjusted in position by set screws 75 for fine adjustment such that the rollers can move toward and away from the rotary disk 23. Also, in this case, if the temperature varies, formation of a minute gap between the disk 23 and each roller 72 can be prevented.

Figure 25:
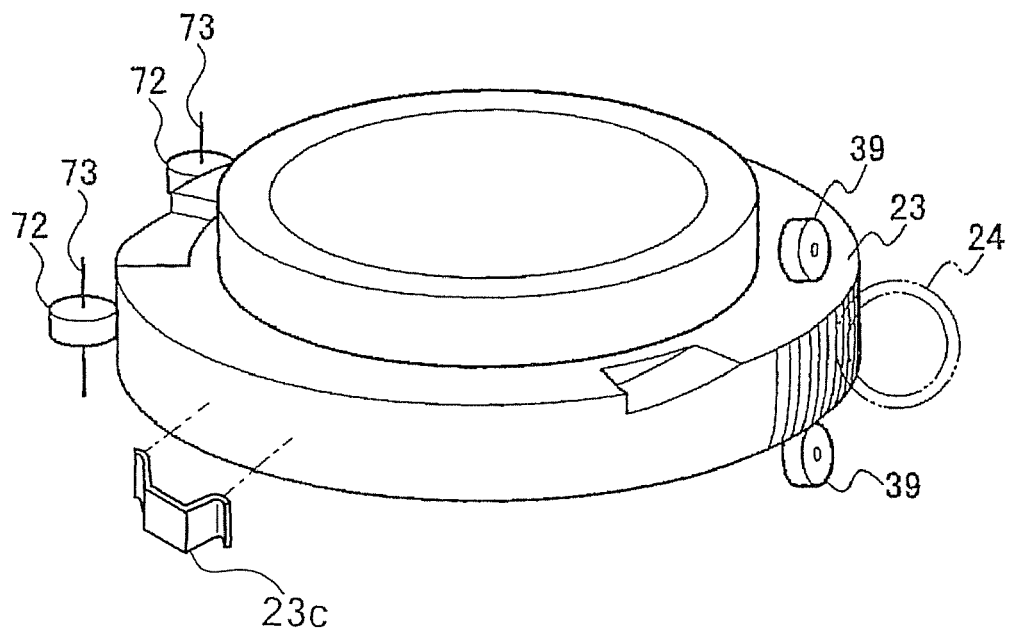
FIG. 25 is a perspective view of a structure that hinders extra rotation of the rotary disk.

Furthermore, a leaf spring 23c is preferably mounted in at least one location on the outer surface of the rotary disk 23 to hinder extra rotation (backlash) of the disk 23 as shown in FIG. 25. The leaf spring 23c has bent end portions abutted against the outer surface of the disk 23, thus hindering extra rotation of the disk 23. Plural leaf springs 23c may be mounted at two or more locations on the outer surface of the rotary disk 23.

Having thus described our invention with the detail and particularity required by the Patent Laws, what is desired protected by Letters Patent is set forth in the following claims.

The invention claimed is:

1. A specimen stage-moving device for use in a charged-particle beam system having an objective lens, said specimen stage-moving device comprising:
a top-entry specimen stage in which the specimen is placed in a position on the stage from above the objective lens;

an XY-motion mechanism for moving the specimen stage within an XY-plane; and a Z-motion mechanism for moving the specimen stage in a Z-direction perpendicular to the XY-plane, using a rotary mechanism, wherein said XY-motion and Z-motion mechanisms are mounted above the objective lens, wherein said Z-motion mechanism moves the specimen stage in the Z-direction by causing rolling members to pass onto tapering surfaces of a rotary disk that is rotationally manipulated using the rotary mechanism.

2. A specimen stage-moving device for use in a charged-particle beam system as set forth in claim 1, wherein said rolling members are balls, rollers, or bearings.

3. A specimen stage-moving device for use in a charged-particle beam system having an objective lens, said specimen stage-moving device comprising:

a top-entry specimen stage in which the specimen is placed in a position on the stage from above the objective lens;

an XY-motion mechanism for moving the specimen stage within an XY-plane; and a Z-motion mechanism for moving the specimen stage in a Z-direction perpendicular to the XY-plane, using a rotary mechanism, wherein said XY-motion and Z-motion mechanisms are mounted above the objective lens, wherein said Z-motion mechanism has a rotary disk rotationally manipulated using the rotary mechanism and an elevatable disk disposed on the rotary disk, and wherein the Z-motion mechanism moves the specimen stage in the Z-direction by causing point contact members held to a bottom surface of the elevatable disk to pass onto tapering surfaces of the rotary disk.

4. A specimen stage-moving device for use in a charged-particle beam system as set forth in claim 3, wherein said point contact members are balls.

5. A specimen stage-moving device for use in a charged-particle beam system having an objective lens, said specimen stage-moving device comprising:

a top-entry specimen stage in which the specimen is placed in a position on the stage from above the objective lens;

an XY-motion mechanism for moving the specimen stage within an XY-plane; and a Z-motion mechanism for moving the specimen stage in a Z-direction perpendicular to the XY-plane using a rotary mechanism, wherein said XY-motion and Z-motion mechanisms are mounted above the objective lens, wherein said Z-motion mechanism restricts movement of the specimen stage in the Z-direction with a spring.

6. A specimen stage-moving device for use in a charged-particle beam system having an objective lens, said specimen stage-moving device comprising:

a top-entry specimen stage in which the specimen is placed in a position on the stage from above the objective lens;

an XY-motion mechanism for moving the specimen stage within an XY-plane; and a Z-motion mechanism for moving the specimen stage in a Z-direction perpendicular to the XY-plane, using a rotary mechanism, wherein said XY-motion and Z-motion mechanisms are mounted above the objective lens, wherein said Z-motion mechanism causes the rotary mechanism to produce rotation by elongation and contraction of a spring.

7. A specimen stage-moving device for use in a charged-particle beam system having an objective lens, said specimen stage-moving device comprising:

a top-entry specimen stage in which the specimen is placed in a position on the stage from above the objective lens;

an XY-motion mechanism for moving the specimen stage within an XY-plane; and a Z-motion mechanism for moving the specimen stage in a Z-direction perpendicular to the XY-plane, using a rotary mechanism, wherein said XY-motion and Z-motion mechanisms are mounted above the objective lens, wherein said Z-motion mechanism has a rotary disk rotationally manipulated using the rotary mechanism, and wherein a center axis of the rotary disk is set by means of rotating members disposed in at least three locations on the outer surface of the rotary disk such that at least one of the rotating members is placed in each one of the three locations.

8. A specimen stage-moving device for use in a charged-particle beam system having an objective lens, said specimen stage-moving device comprising:

a top-entry specimen stage in which the specimen is placed in a position on the stage from above the objective lens;

an XY-motion mechanism for moving the specimen stage within an XY-plane; and a Z-motion mechanism for moving the specimen stage in a Z-direction perpendicular to the XY-plane using a rotary mechanism, wherein said XY-motion and Z-motion mechanisms are mounted above the objective lens, wherein said Z-motion mechanism has a rotary disk rotationally manipulated using the rotary mechanism, and wherein the Z-motion mechanism has a leaf spring for hindering rotation of the rotary disk in at least one location on the outer surface of the rotary disk.

9. A specimen stage-moving device for use in a charged-particle beam system having an objective lens, said specimen stage-moving device comprising:

a top-entry specimen stage in which the specimen is placed in a position on the stage from above the objective lens;

an XY-motion mechanism for moving the specimen stage within an XY-plane; and a Z-motion mechanism for moving the specimen stage in a Z-direction perpendicular to the XY-plane, using a rotary mechanism, wherein said XY-motion and Z-motion mechanisms are mounted above the objective lens, wherein (A) said Z-motion mechanism has a rotary disk rotationally manipulated using the rotary mechanism, (B) the rotary disk has an outer surface on which a worm wheel is formed, (C) the rotary disk is rotationally manipulated by the rotary mechanism via a worm gear in mesh with the worm wheel, (D) the worm wheel and the worm gear have their respective sliding portions which slide on each other, and (E) a solid lubricative coating is formed on each of the sliding portions.

10. A specimen stage-moving device for use in a charged-particle beam system as set forth in claim 9, wherein said solid lubricative coating is made of a fluorocarbon resin.

* * * * *